(12) United States Patent
Lee et al.

(10) Patent No.: US 11,348,969 B2
(45) Date of Patent: May 31, 2022

(54) DISPLAY DEVICES

(71) Applicant: InnoLux Corporation, Miao-Li County (TW)

(72) Inventors: Kuan-Feng Lee, Miao-Li County (TW); Yuan-Lin Wu, Miao-Li County (TW); Yu-Hsien Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/890,009

(22) Filed: Jun. 2, 2020

(65) Prior Publication Data

US 2020/0295081 A1 Sep. 17, 2020

Related U.S. Application Data

(63) Continuation of application No. 15/692,031, filed on Aug. 31, 2017, now Pat. No. 10,707,265.

(Continued)

(51) Int. Cl.
*H01L 33/50* (2010.01)
*H01L 27/32* (2006.01)
(Continued)

(52) U.S. Cl.
CPC ........ *H01L 27/156* (2013.01); *H01L 25/0753* (2013.01); *H01L 27/3202* (2013.01); *H01L 27/3216* (2013.01); *H01L 27/3218* (2013.01); *H01L 33/502* (2013.01); *H01L 33/504* (2013.01); *H01L 33/505* (2013.01); *H01L 33/58* (2013.01); *H01L 33/60* (2013.01);
(Continued)

(58) Field of Classification Search
CPC ............ H01L 27/3216; H01L 27/3218; H01L 27/3202; H01L 27/3206; H01L 27/3211; H01L 33/502; H01L 33/504
See application file for complete search history.

(56) References Cited

U.S. PATENT DOCUMENTS 9,472,734 B1 10/2016 Chen et al.
9,484,504 B2 11/2016 Bibl et al.
(Continued)

OTHER PUBLICATIONS

Extended European Search Report dated Feb. 16, 2021, issued in application No. EP 20189975.4.

*Primary Examiner* — Phat X Cao
(74) *Attorney, Agent, or Firm* — McClure, Qualey & Rodack, LLP

(57) ABSTRACT

A display device is provided. The display device includes a substrate, and a first sub-pixel and a second sub-pixel disposed on the substrate, wherein the first sub-pixel and the second sub-pixel respectively correspond to two different colors. The first sub-pixel includes a first light-emitting element and a first wavelength conversion layer adjacent to the first light-emitting element, wherein a light emitted from the first light-emitting element passes through the first wavelength conversion layer. The second sub-pixel includes a second light-emitting element and a second wavelength conversion layer adjacent to the second light-emitting element, wherein a light emitted from the second light-emitting element passes through the second wavelength conversion layer. An area of the first wavelength conversion layer and an area of the second wavelength conversion layer are different.

8 Claims, 16 Drawing Sheets

Related U.S. Application Data

(60) Provisional application No. 62/512,733, filed on May 31, 2017.

(51) Int. Cl.
| | | |
|---|---|---|
| *H01L 27/15* | (2006.01) | |
| *H01L 25/075* | (2006.01) | |
| *H01L 33/58* | (2010.01) | |
| *H01L 33/60* | (2010.01) | |
| *H01L 25/16* | (2006.01) | |
| *H01L 33/06* | (2010.01) | |
| *H01L 33/32* | (2010.01) | |
| *H01L 33/62* | (2010.01) | |

(52) U.S. Cl.
CPC ............ *H01L 25/167* (2013.01); *H01L 33/06* (2013.01); *H01L 33/325* (2013.01); *H01L 33/507* (2013.01); *H01L 33/62* (2013.01)

(56) References Cited

U.S. PATENT DOCUMENTS

| | | | | |
|---|---|---|---|---|
| 2011/0260601 | A1* | 10/2011 | Leatherdale | H01L 33/08 313/483 |
| 2014/0054619 | A1* | 2/2014 | Tseng | H01L 33/505 257/88 |
| 2015/0129851 | A1* | 5/2015 | Lee | H01L 27/3211 257/40 |
| 2015/0279822 | A1* | 10/2015 | Hsu | H01L 25/0753 257/89 |
| 2015/0340655 | A1* | 11/2015 | Lee | H01L 27/3244 257/40 |
| 2016/0372528 | A1* | 12/2016 | Kamura | H01L 27/3211 |
| 2017/0133357 | A1* | 5/2017 | Kuo | H01L 25/0753 |
| 2018/0190712 | A1* | 7/2018 | Xu | H01L 33/0012 |

* cited by examiner

DISPLAY DEVICES

CROSS REFERENCE TO RELATED APPLICATIONS

This application is a Continuation of application Ser. No. 15/692,031, filed Aug. 31, 2017, now U.S. Pat. No. 10,707,265, which claims the benefit of U.S. Provisional Application No. 62/512,733, filed May 31, 2017, the entirety of which is incorporated by reference herein.

BACKGROUND

Field of the Disclosure

The disclosure relates to display devices, and in particular to display devices having wavelength conversion layers of different sizes.

Description of the Related Art

A light-emitting diode (LED) display is a flat panel display that uses an array of light-emitting diodes integrated with a thin-film transistor (TFT) circuit by bonding treatment to form an electrical connection and serve as pixels (or sub-pixels) for the display. Because of the self-illumination properties of the light-emitting diode display, the backlight module can be omitted. As a result, the light-emitting diode display can be thinner and lighter, and competitive advantages can be obtained. In comparison to an organic light-emitting diode (OLED) display, the light-emitting diode display is more stable and has a longer lifespan, a higher brightness, and a shorter response time. Thus, light-emitting diode displays have gradually been adopted in many mainstream display products of the next generation.

Although existing display devices using light-emitting diodes as pixels have been adequate for their intended purposes, they have not been entirely satisfactory in all respects. Therefore, there are still some problems that remain to be overcome with regards to the display devices using light-emitting diodes as pixels.

BRIEF SUMMARY

Conversion efficiency is the ratio of the energy of the light converted by a wavelength conversion layer to the energy of the light emitted from a light-emitting element disposed under the wavelength conversion layer. Since the conversion efficiency of wavelength conversion layers in different sub-pixels of different colors may not be the same, the brightness of the display device may be unevenly distributed and the display quality of the display device will be decreased.

The embodiments of the display devices have wavelength conversion layers of different sizes in different sub-pixels. The different sizes are a result of there being a different area from a top view and/or different thickness among the wavelength conversion layers. Thereby, the energy of the light converted by the wavelength conversion layers of different sizes can be similar or the same in different sub-pixels of different colors. As a result, the brightness distribution of the light emitted from the display device can be more uniform, and the color gamut can be wider. Moreover, the color temperature of the entire display device can also be fine-tuned by adjusting the area and/or the thickness of the wavelength conversion layers for different sub-pixels of the display device.

Some embodiments of the disclosure provide a display device. The display device includes a substrate, and a first sub-pixel and a second sub-pixel disposed on the substrate, wherein the first sub-pixel and the second sub-pixel respectively correspond to two different colors. The first sub-pixel includes a first light-emitting element, and a first wavelength conversion layer adjacent to the first light-emitting element, wherein a light emitted from the first light-emitting element passes through the first wavelength conversion layer. The second sub-pixel includes a second light-emitting element, and a second wavelength conversion layer adjacent to the second light-emitting element, wherein a light emitted from the second light-emitting element passes through the second wavelength conversion layer. An area of the first wavelength conversion layer and an area of the second wavelength conversion layer are different.

Some embodiments of the disclosure provide a display device. The display device includes a substrate, and a first sub-pixel and a second sub-pixel disposed on the substrate, wherein the first sub-pixel and the second sub-pixel respectively correspond to two different colors. The first sub-pixel includes a first light-emitting element, and a first wavelength conversion layer adjacent to the first light-emitting element, wherein a light emitted from the first light-emitting element passes through the first wavelength conversion layer. The second sub-pixel includes a second light-emitting element, and a second wavelength conversion layer adjacent to the second light-emitting element, wherein a light emitted from the second light-emitting element passes through the second wavelength conversion layer. A thickness of the first wavelength conversion layer and a thickness of the second wavelength conversion layer are different.

Some embodiments of the disclosure provide a display device. The display device includes a substrate, and a first sub-pixel and a second sub-pixel disposed on the substrate, wherein the first sub-pixel and the second sub-pixel respectively correspond to two different colors. The first sub-pixel includes a first light-emitting element, and a first wavelength conversion layer adjacent to the first light-emitting element, wherein a light emitted from the first light-emitting element passes through the first wavelength conversion layer. The second sub-pixel includes a second light-emitting element, and a second wavelength conversion layer adjacent to the second light-emitting element, wherein a light emitted from the second light-emitting element passes through the second wavelength conversion layer. The display device also includes a first electrode disposed on the substrate, wherein the first light-emitting element and the second light-emitting element are electrically connected to the first electrode.

Some embodiments of the disclosure provide a display device. The display device includes a substrate, a light-emitting element disposed on the substrate, a first wavelength conversion element disposed on the substrate, and a passivation layer. The first wavelength conversion element is disposed between the light-emitting element and the passivation layer. A light emitted from the light-emitting element passes through the first wavelength conversion element and the passivation layer.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1A:
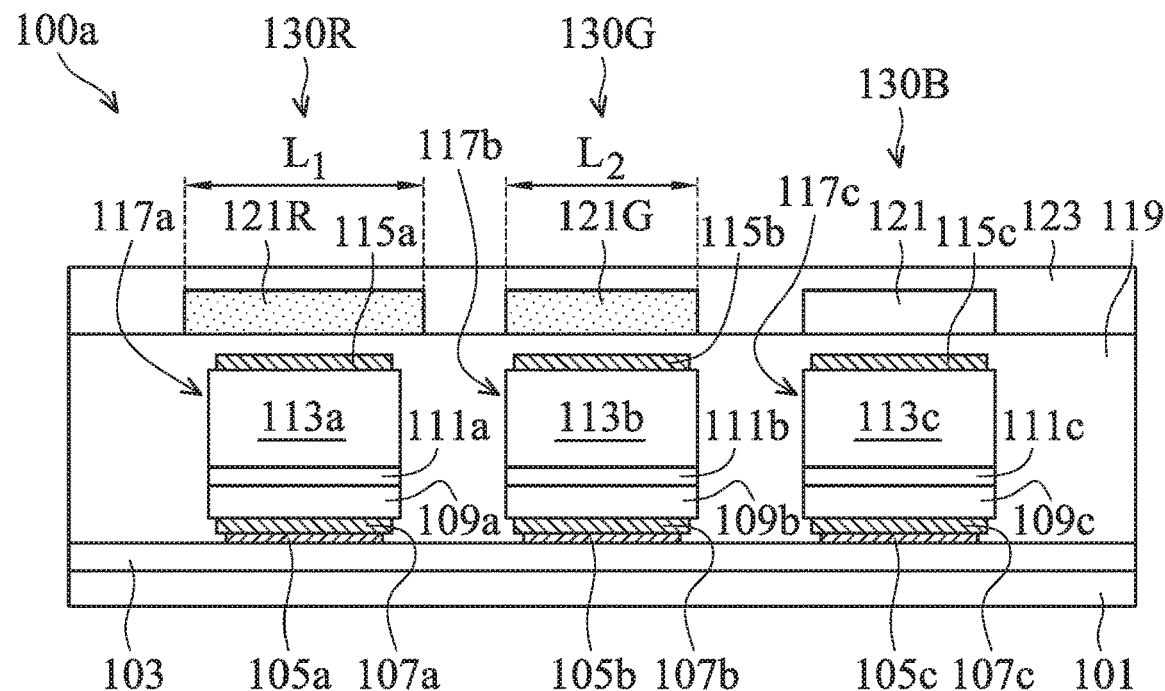
FIGS. 1A to 1C are cross-sectional views of display devices in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Embodiments for display devices are provided. Referring to FIG. 1A, a cross-sectional view of a display device 100a according to some embodiments is shown.

As shown in FIG. 1A, a substrate 101 is provided, and a driving layer 103 is formed on the substrate 101, in accordance with some embodiments. The substrate 101 may be a glass substrate or a plastic substrate. The driving layer 103 can include a plurality of thin-film transistors (TFT), capacitors, conductive layers, contact windows, insulating layers and/or other semiconductor devices. Moreover, a plurality of conductive pads 105a, 105b and 105c are formed on the driving layer 103. The quantity of the conductive pads 105a, 105b and 105c disposed on the driving layer 103 are not limited to three, and the conductive pads 105a, 105b and 105c are made of metal with good electric conductivity, such as gold (Au), silver (Ag), copper (Cu), platinum (Pt), aluminum (Al), nickel (Ni), tin (Sn), magnesium (Mg), a combination thereof, or another conductive material.

Still referring to FIG. 1A, a plurality of light-emitting elements 117a, 117b and 117c are disposed on and electrically connected to the conductive pads 105a, 105b and 105c, respectively. As with the quantity of the conductive pads 105a, 105b and 105c, the quantity of the light-emitting elements 117a, 117b and 117c is also not limited to three.

Specifically, a plurality of P-type electrodes 107a, 107b and 107c are respectively disposed on the conductive pads 105a, 105b and 105c, a plurality of P-type semiconductor layers 109a, 109b and 109c are respectively disposed on the P-type electrodes 107a, 107b and 107c, a plurality of multiple quantum well (MQW) layers 111a, 111b and 111c are respectively disposed on the P-type semiconductor layers 109a, 109b and 109c, a plurality of N-type semiconductor layers 113a, 113b and 113c are respectively disposed on the multiple quantum well layers 111a, 111b and 111c, and a plurality of N-type electrodes 115a, 115b and 115c are respectively disposed on the N-type semiconductor layers 113a, 113b and 113c.

The light-emitting element 117a is composed of the P-type electrode 107a, the P-type semiconductor layer 109a, the multiple quantum well layer 111a, the N-type semiconductor layer 113a and the N-type electrode 115a. Similarly, the light-emitting element 117b is composed of the P-type electrode 107b, the P-type semiconductor layer 109b, the multiple quantum well layer 111b, the N-type semiconductor layer 113b and the N-type electrode 115b. Also, the light-emitting element 117c is composed of the P-type electrode 107c, the P-type semiconductor layer 109c, the multiple quantum well layer 111c, the N-type semiconductor layer 113c and the N-type electrode 115c. In other embodiments, the light-emitting elements 117a, 117b and 117c may be bonded to the conductive pads 105a, 105b and 105c by an anisotropic conductive film (ACF) (not shown) containing conductive particles.

In some embodiments, the light-emitting elements 117a, 117b and 117c are electrically connected to the conductive pads 105a, 105b and 105c respectively through the P-type electrodes 107a, 107b and 107c. Moreover, the light-emitting elements 117a, 117b and 117c may be micro light-emitting diodes (μ-LEDs). Specifically, the micro light-emitting diodes have a length and a width about dozens of microns, and a height about ten microns. In particular, the micro light-emitting diodes may have a height in a range from about 5 microns to about 8 microns.

In some embodiments, the P-type electrodes 107a, 107b, 107c and the N-type electrodes 115a, 115b, 115c are made of a metal with good electrical conductivity, such as gold (Au), silver (Ag), copper (Cu), platinum (Pt), aluminum (Al), nickel (Ni), tin (Sn), magnesium (Mg), aluminum (Al), a combination thereof, or another conductive material, such as indium tin oxide, (ITO). Moreover, the P-type electrodes 107a, 107b, 107c and the N-type electrodes 115a, 115b, 115c are formed by a deposition process and a patterning process. The deposition process may be a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, a plasma enhanced chemical vapor deposition (PECVD) process, or a combination thereof. The patterning process may include a photolithography process and an etching process.

In addition, the base material of the P-type semiconductor layers 109a, 109b, 109c and the N-type semiconductor layers 113a, 113b, 113c may be gallium nitride (GaN), aluminum nitride (AlN), aluminum gallium nitride (AlGaN), indium gallium aluminum nitride (InGaAlN), or a combination thereof, and may be formed by using a metal organic chemical vapor deposition (MOCVD) process, a molecular beam epitaxy (MBE), or a combination thereof. Then, the P-type semiconductor layers 109a, 109b, 109c are implanted with suitable P-type dopants, such as boron (B), gallium (Ga), Indium (In) or the like. The N-type semiconductor layers 113a, 113b, 113c are implanted with suitable N-type dopants, such as phosphorous (P), arsenic (As) or the like. In some embodiments, the multiple quantum well layers 111a, 111b, 111c are sandwiched between the P-type semiconductor layers 109a, 109b, 109c and the N-type semiconductor layers 113a, 113b, 113c. In other embodiments, the multiple quantum well layers 111a, 111b, 111c may be replaced with single quantum well layers.

Still referring to FIG. 1A, a first passivation layer 119 is formed on the driving layer 103 and covering the light-emitting elements 117a, 117b and 117c. Then, wavelength conversion layers 121R and 121G and an organic layer 121 are formed on the first passivation layer 119. Specifically, the wavelength conversion layer 121R is disposed directly above the light-emitting element 117a, the wavelength conversion layer 121G is disposed directly above the light-emitting element 117b, and the organic layer 121 is disposed directly above the light-emitting element 117c. After forming the wavelength conversion layers 121R, 121G and the organic layer 121, a second passivation layer 123 is formed on the first passivation layer 119 and covering the wavelength conversion layers 121R, 121G and the organic layer 121.

In some embodiments, the first passivation layer 119 is made of silicon oxide, silicon nitride, silicon oxynitride or another suitable transparent insulating material, and may be formed by a deposition process, a stamping process, an injecting process, or another suitable process. The wavelength conversion layers 121R and 121G may be made of, but are not limited to, phosphor layers, fluorescent powder layers, quantum-dot layers, epoxy resin layers combined with quantum-dot materials (the quantum-dot materials may be, for example, ZnS, ZnSe, ZnTe, CdSe, CdTe, CdS, GaN, InN, InP, InAs, PbS, PbSe), silicone resin layers combined with quantum-dot materials or combinations thereof and formed by injecting processes or coating processes. The wavelength conversion layers 121R and 121G may be made of different materials.

The wavelength conversion layers 121R and 121G can convert the wavelength of the light emitted from the light-emitting elements 117a and 117b, so that the color of the light emitted from the light-emitting elements 117a and 117b may be changed. In this embodiment, the light-emitting elements 117a, 117b and 117c are blue light-emitting diodes. The blue light emitted from the light-emitting element 117a can be converted to a red light by the wavelength conversion layer 121R, and the blue light emitted from the light-emitting element 117b can be converted to a green light by the wavelength conversion layer 121G. The organic layer 121 may be made of a transparent organic material and formed by a deposition process, a stamping process, an injecting process, or another suitable process. In this embodiment, the blue light emitted from the light-emitting element 117c is not converted to other colors, and the wavelength of the light remains unchanged. Therefore, the light passing through the organic layer 121 is still a blue light without any changes.

Some materials and processes used to form the second passivation layer 123 are similar to, or the same as, those used to form the first passivation layer 119, so the descriptions thereof are not repeated herein. As a result, the display device 100a includes a plurality sub-pixels 130R, 130G and 130B. In this embodiment, the sub-pixel 130R is a red sub-pixel, the sub-pixel 130G is a green sub-pixel and the sub-pixel 130B is a blue sub-pixel.

As shown in the cross-sectional view of FIG. 1A, the wavelength conversion layer 121R has a length L1, the wavelength conversion layer 121G has a length L2, and the length L1 is greater than the length L2. As a result, from a top view of the display device 100a, the area of the wavelength conversion layer 121R is greater than the area of the wavelength conversion layer 121G.

The wavelength conversion layer 121R has a first conversion efficiency, which is defined as the ratio of energy of the light converted by the wavelength conversion layer 121R to the energy of the light emitted from the light-emitting element 117a. The wavelength conversion layer 121G has a second conversion efficiency, which is defined as the ratio of energy of the light converted by the wavelength conversion layer 121G to the energy of the light emitted from the light-emitting element 117b.

In the embodiment of FIG. 1A, the second conversion efficiency of the wavelength conversion layer 121G is greater than the first conversion efficiency of the wavelength conversion layer 121R. Therefore, by setting the area of the wavelength conversion layer 121G less than the area of the wavelength conversion layer 121R, the energy of the light converted by the wavelength conversion layers 121R and 121G can be similar or the same. As a result, the brightness distribution of the light emitted from the display device 100a can be more uniform, and the color gamut can be wider. Moreover, the color temperature of the entire display device can be fine-tuned by adjusting the area and/or the thickness of the wavelength conversion layers for different sub-pixels of the display device.

Since the conversion efficiency may depend on the material of the wavelength conversion layers 121R and 121G, if the first conversion efficiency of the wavelength conversion layer 121R is greater than the second conversion efficiency of the wavelength conversion layer 121G, the area of the wavelength conversion layer 121R should be less than the area of the wavelength conversion layer 121G.

Figure 1B:
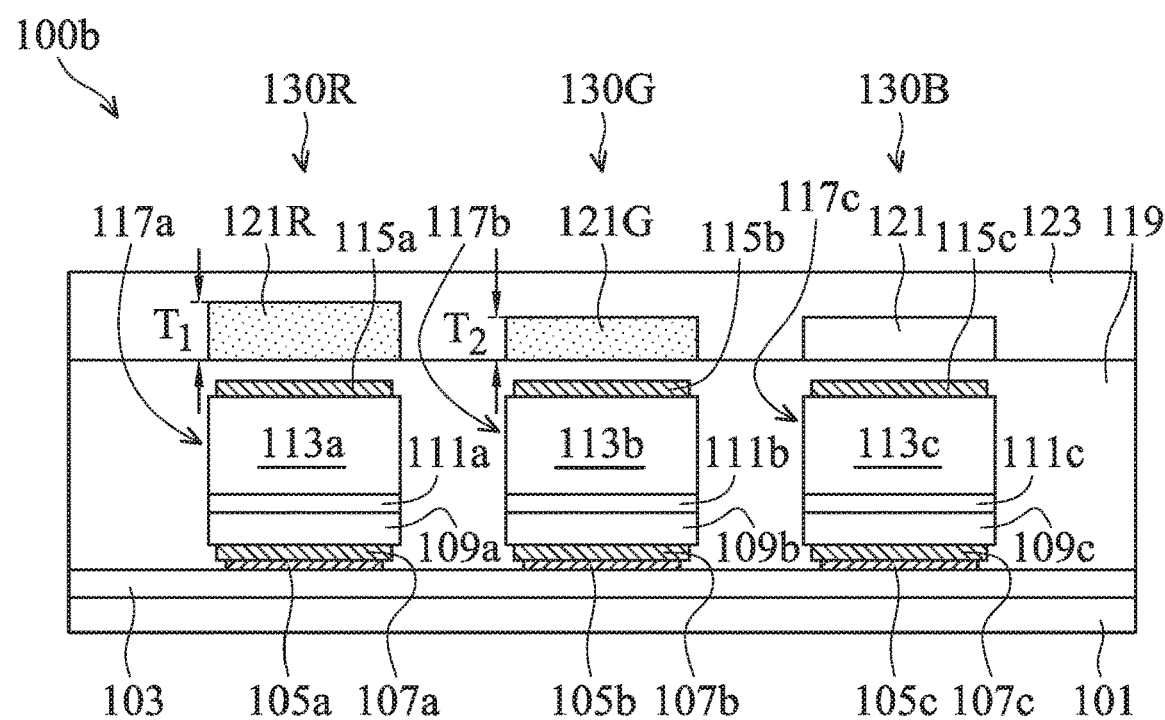

Referring to FIG. 1B, a cross-sectional view of a display device 100b according to some embodiments is shown. In the embodiment of FIG. 1B, the wavelength conversion layer 121R has a thickness T1, the wavelength conversion layer 121G has a thickness T2. Since the second conversion efficiency of the wavelength conversion layer 121G is greater than the first conversion efficiency of the wavelength conversion layer 121R, the thickness T1 is adjusted to be greater than the thickness T2. In addition, the length (or the area, from a top view) of each of the wavelength conversion layer 121R and 121G is the same. In other embodiments, both the thickness and the area of wavelength conversion layer 121R can be different from the thickness and the area of wavelength conversion layer 121G.

In the embodiment of FIG. 1B, by setting the thickness T2 of the wavelength conversion layer 121G less than the thickness T1 of the wavelength conversion layer 121R, the energy of the light converted by the wavelength conversion layers 121R and 121G can be similar or the same. As a result, the brightness distribution of the light emitted from different sub-pixels of the display device 100b can be more uniform, and the color gamut can be wider.

Since the conversion efficiency may depend on the material of the wavelength conversion layers 121R and 121G, if the first conversion efficiency of the wavelength conversion layer 121R is greater than the second conversion efficiency of the wavelength conversion layer 121G, the thickness of the wavelength conversion layer 121R should be less than the thickness of the wavelength conversion layer 121G.

Figure 1C:
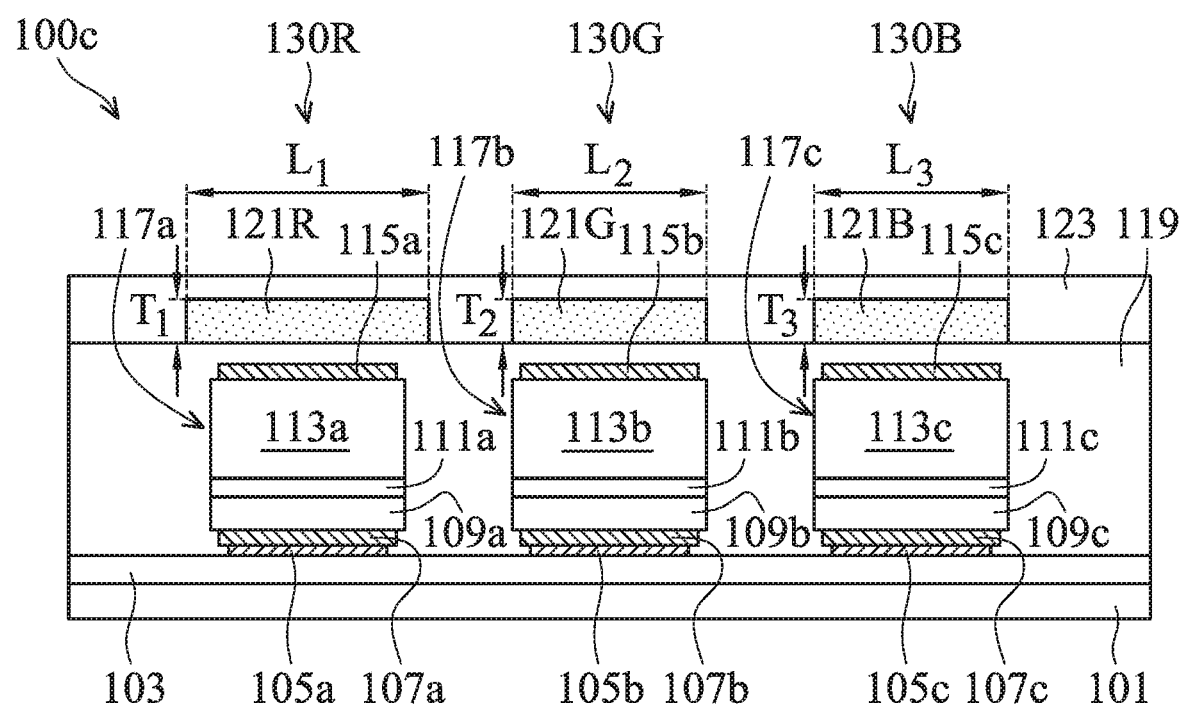

Referring to FIG. 1C, a cross-sectional view of a display device 100c according to some embodiments is shown. In comparison with the display device 100a of FIG. 1A, the organic layer 121 of the display device 100a of FIG. 1A is replaced by a wavelength conversion layer 121B. The wavelength conversion layer 121B can convert the wavelength of the light emitted from the light-emitting element 117c, so that the wavelength of the light emitted from the light-emitting element 117c may be changed.

In the embodiment of FIG. 1C, the light-emitting element 117c is a blue light-emitting diode, and the wavelength of the blue light converted by the wavelength conversion layer 121B is different from the wavelength of the blue light emitted from the light-emitting element 117c. For example, the wavelength of the blue light emitted from the light-emitting element 117c is 420 nm, and the wavelength of the blue light converted by the wavelength conversion layer 121B is 450 nm.

In some embodiments, the length L1 of the wavelength conversion layer 121R can be greater than the length L2 of the wavelength conversion layer 121G and the length L3 of the wavelength conversion layer 121B, and the thickness T1 of the wavelength conversion layer 121R can be the same as the thickness T2 of the wavelength conversion layer 121G and the thickness T3 of the wavelength conversion layer 121B. In other embodiments, the length L1 of the wavelength conversion layer 121R can be less than the length L2 of the wavelength conversion layer 121G and the length L3 of the wavelength conversion layer 121B, and the thickness T1 of the wavelength conversion layer 121R can be different from the thickness T2 of the wavelength conversion layer 121G and the thickness T3 of the wavelength conversion layer 121B.

In the embodiments of FIGS. 1A to 1C, the first conversion efficiency of the wavelength conversion layer 121R is less than the second conversion efficiency of the wavelength conversion layer 121G. Thus, the area and/or the thickness of the wavelength conversion layer 121R is adjusted to be greater than the area and/or the thickness of the wavelength conversion layer 121G. However, in other embodiments, if the first conversion efficiency of the wavelength conversion layer 121R is greater than the second conversion efficiency of the wavelength conversion layer 121G, the area and/or the thickness of the wavelength conversion layer 121R may be adjusted to be less than the area and/or the thickness of the wavelength conversion layer 121G.

Figure 2A:
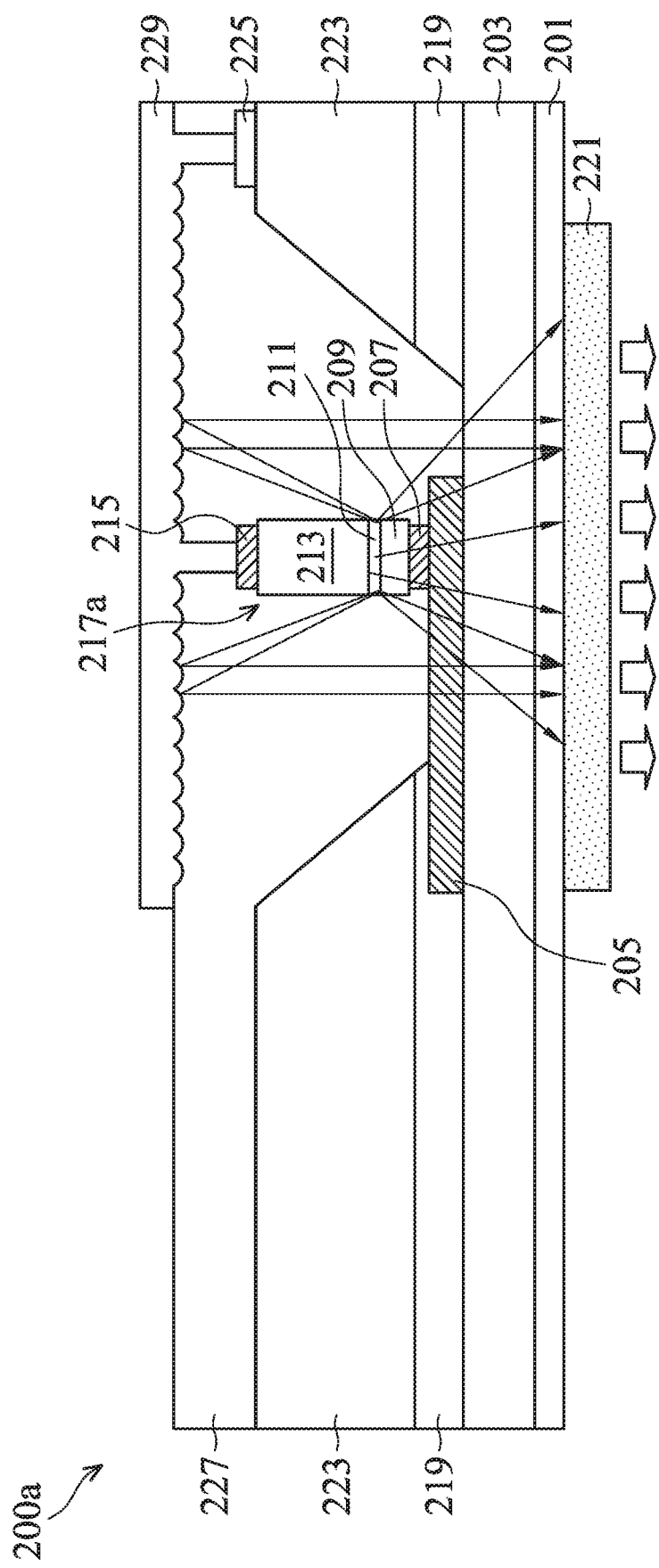
FIGS. 2A to 2F are cross-sectional views of display devices in accordance with some embodiments.

Referring to FIG. 2A, a cross-sectional view of a display device 200a according to some embodiments is shown. In the embodiment of FIG. 2A, the display device 200a is a bottom-emission display device having a light-emitting element 217a of a vertical type light-emitting diode.

As shown in FIG. 2A, the light-emitting element 217a is composed of a P-type electrode 207, a P-type semiconductor layer 209, a multiple quantum well layer 211, an N-type semiconductor layer 213, and an N-type electrode 215. In some embodiments, the light-emitting element 217a is disposed on a conductive pad 205 on a driving layer 203, and the driving layer 203 is disposed on a substrate 201. The light-emitting element 217a is electrically connected to the driving layer 203 through the conductive pad 205.

Moreover, the display device 200a further includes a passivation layer 219 on the driving layer 203, an organic layer 223 on the passivation layer 219, and a planarization layer 227 on the organic layer 223. The passivation layer 219 and the organic layer 223 have an opening in which the light-emitting element 217a is disposed, and the light-emitting element 217a is not in directly contact with the passivation layer 219 and the organic layer 223. The planarization layer 227 filled up the opening of the passivation layer 219 and the organic layer 223. Thus, a portion of the planarization layer 227 is disposed between the light-emitting element 217a and the passivation layer 219 and the organic layer 223.

Still referring to FIG. 2A, a reflective layer 229 is disposed on the planarization layer 227, and the reflective layer 229 is electrically connected to the light-emitting element 217a through the N-type electrode 215, and electrically connected to the driving layer 203 through a conductive pad 225 on the organic layer 223 and a plurality of conductive vias (not shown) in the organic layer 223 and the passivation layer 219.

The reflective layer 229 is made of a metal material, such as aluminum (Al), and the surface of the reflective layer 229 facing the light-emitting element 217a has a plurality of bumps. Thereby, the light emitted from the light-emitting element 217a can be reflected by the reflective layer 229 efficiently.

In addition, the display device 200a further includes a wavelength conversion layer 221 disposed on the other side of the substrate 201. That is, the substrate 201 is disposed between the light-emitting element 217a and the wavelength conversion layer 221. The light emitted from the light-emitting element 217a is reflected by the reflective layer 229 and transmitted through the driving layer 203, the substrate 201, and finally passing through the wavelength conversion layer 221.

Figure 2B:
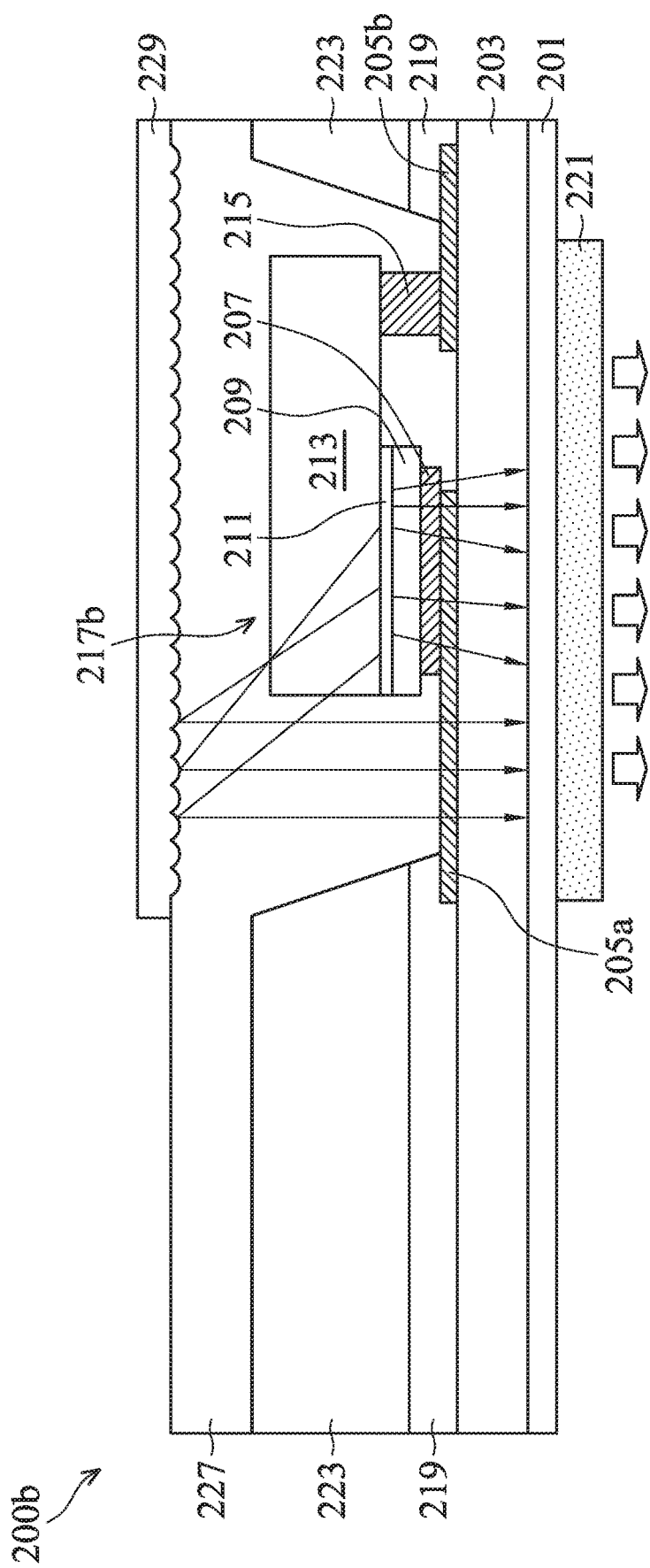

Referring to FIG. 2B, a cross-sectional view of a display device 200b according to some embodiments is shown. In the embodiment of FIG. 2B, the light-emitting element 217a of FIG. 2A is replaced by a light-emitting element 217b, and the light-emitting element 217b is a flip-chip type light-emitting diode. Similar to the embodiment of FIG. 2A, the substrate 201 is disposed between the light-emitting element 217b and the wavelength conversion layer 221.

In addition, the display device 200b of FIG. 2B further includes a first conductive pad 205a disposed between the P-type electrode 207 and the driving layer 203, and a second conductive pad 205b disposed between the N-type electrode 215 and the driving layer 203. As a result, the light-emitting element 217b of the display device 200b is electrically connected to driving layer 203 through the first conductive pad 205a and the second conductive pad 205b.

Figure 2C:
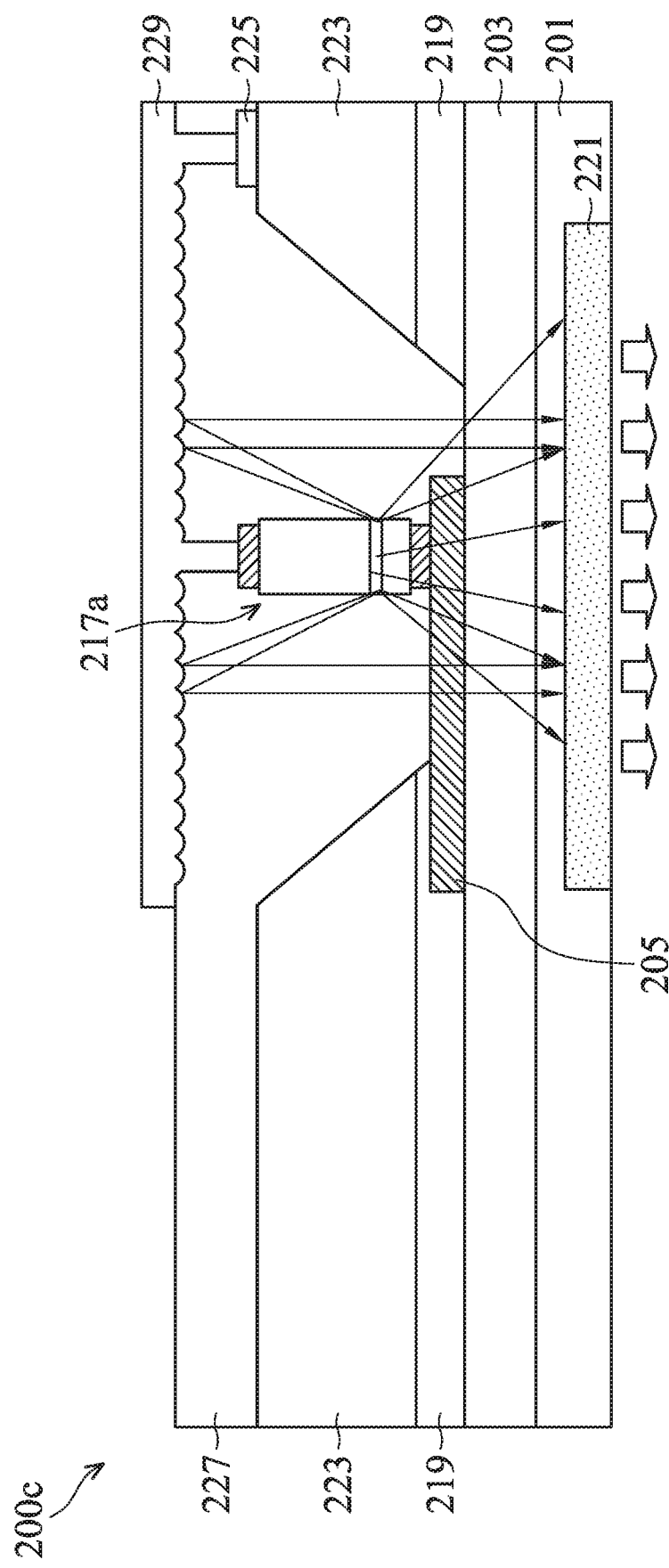

Referring to FIG. 2C, a cross-sectional view of a display device 200c according to some embodiments is shown. The display device 200c has similar structures to the display device 200a shown in FIG. 2A. The light-emitting element 217a is a vertical type light-emitting diode, and the wavelength conversion layer 221 is embedded in the substrate 201 and a surface of the wavelength conversion layer 221 is level with a surface of the substrate 201. As a result, a portion of the substrate 201 is disposed between the light-emitting element 217a and the wavelength conversion layer 221. The light emitted from the light-emitting element 217a is reflected by the reflective layer 229, and then sequentially passes through the driving layer 203, the portion of the substrate 201 that is disposed between the light-emitting element 217a and the wavelength conversion layer 221, and finally passes through the wavelength conversion layer 221.

Figure 2D:
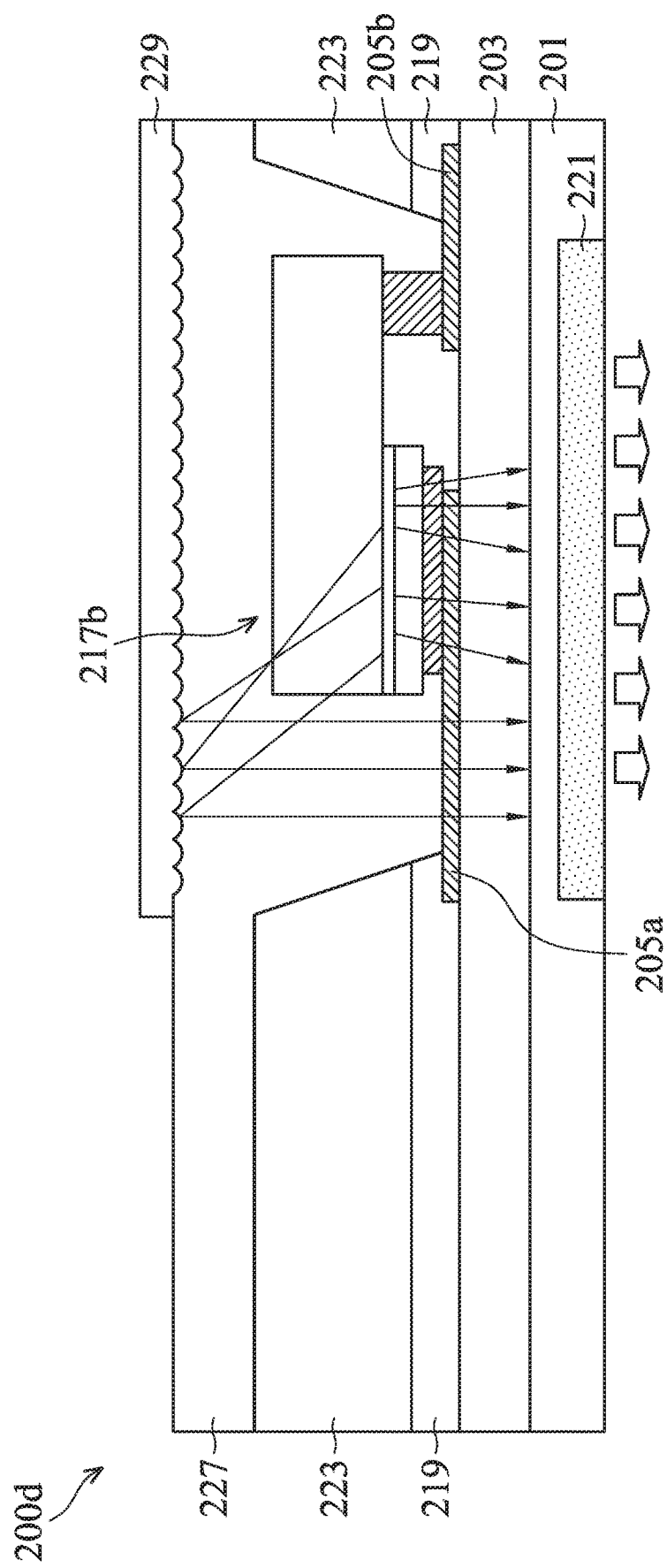

Referring to FIG. 2D, a cross-sectional view of a display device 200d according to some embodiments is shown. In the embodiment of FIG. 2D, the light-emitting element 217a of FIG. 2C is replaced by a light-emitting element 217b, and the light-emitting element 217b is a flip-chip type light-emitting diode. Similar to the embodiment of FIG. 2C, the wavelength conversion layer 221 is embedded in the substrate 201 and a surface of the wavelength conversion layer 221 is level with a surface of the substrate 201. As a result, a portion of the substrate 201 is disposed between the light-emitting element 217b and the wavelength conversion layer 221.

Figure 2E:
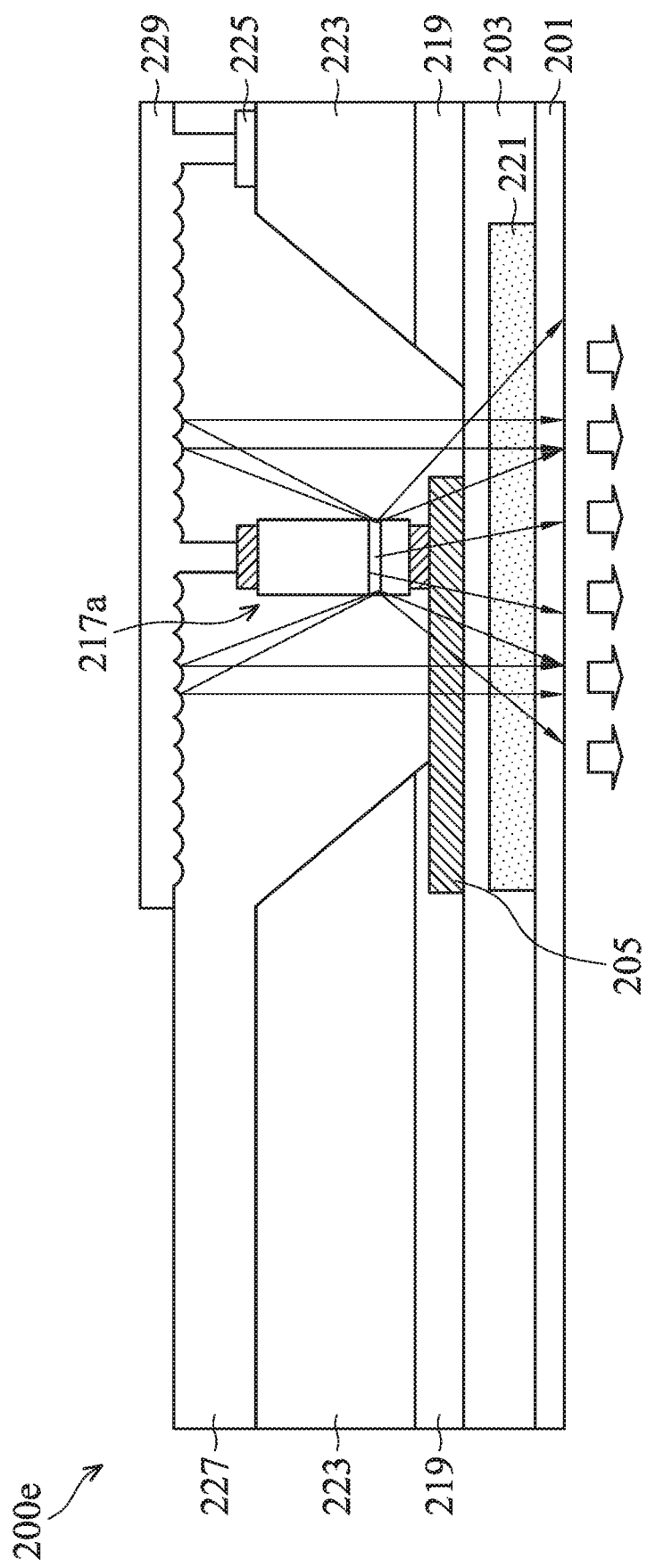

Referring to FIG. 2E, a cross-sectional view of a display device 200e according to some embodiments is shown. The display device 200e has similar structures to the display devices 200a and 200c. The different is that the wavelength conversion layer 221 of the display device 200e is disposed between the substrate 201 and the light-emitting element 217a. In particular, the wavelength conversion layer 221 is embedded in the driving layer 203 and in direct contact with the substrate 201. The light emitted from the light-emitting element 217a is reflected by the reflective layer 229, and then sequentially passes through the driving layer 203, the wavelength conversion layer 221 and the substrate 201.

Figure 2F:
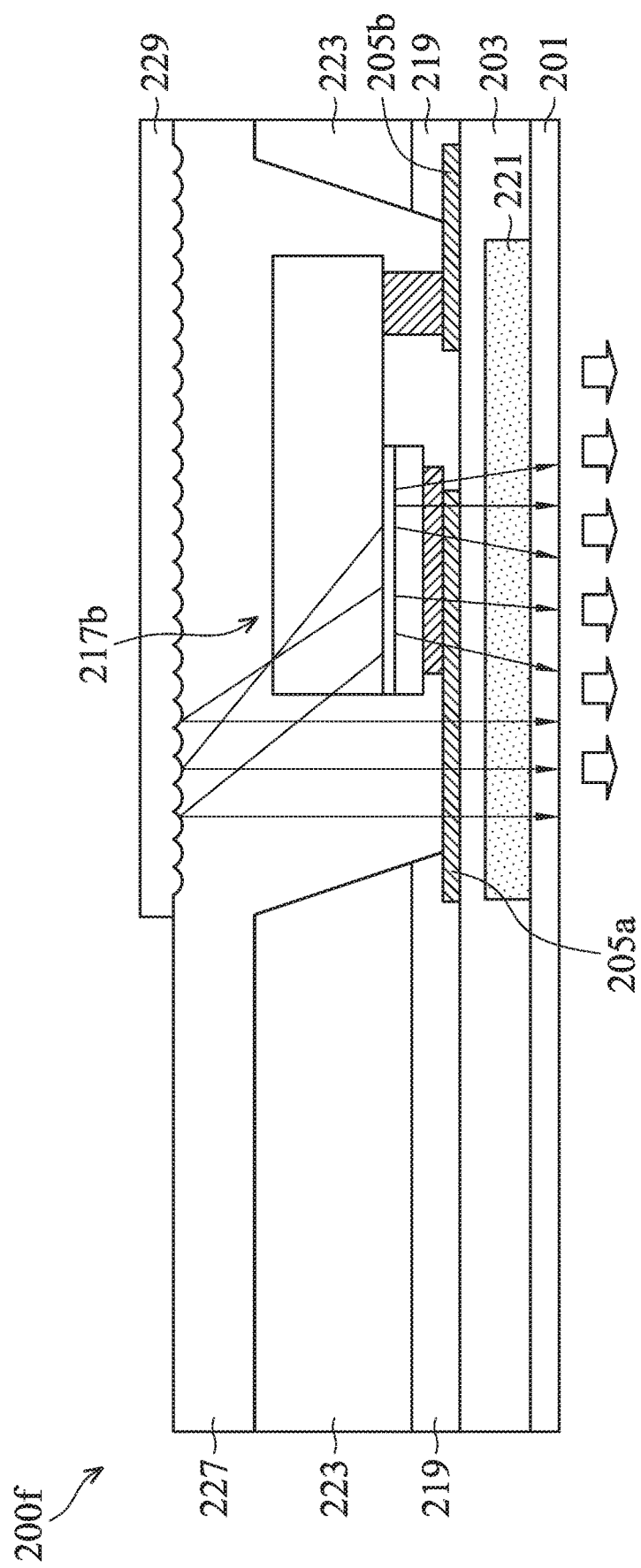

Referring to FIG. 2F, a cross-sectional view of a display device 200f according to some embodiments is shown. In the embodiment of FIG. 2F, the light-emitting element 217a of FIG. 2E is replaced by a light-emitting element 217b, and the light-emitting element 217b is a flip-chip type light-emitting diode. Similar to the embodiment of FIG. 2E, the wavelength conversion layer 221 is disposed between the substrate 201 and the light-emitting element 217b. Specifically, the wavelength conversion layer 221 is embedded in the driving layer 203 and in direct contact with the substrate 201.

In comparison with the top-emission display devices 100a, 100b and 100c shown in FIGS. 1A to 1C, the bottom-emission display devices 200a, 200b, 200c, 200d, 200e and 200f of FIGS. 2A to 2F are widely applied in large-scale displays since the N-type electrode 215 of the light-emitting elements 217a and 217b can be made of opaque conductive materials, such as metals, and the electric resistance of the opaque conductive materials may be smaller than the transparent conductive materials, especially in the large-scale displays application.

Moreover, although each of FIGS. 2A to 2F shows only one light-emitting element 217a or 217b, and one wavelength conversion layer 221, each of the display devices 200a, 200b, 200c, 200d, 200e and 200f can actually have more than one light-emitting element 217a or 217b, and more than one wavelength conversion layer 221. It is important to note that each of the display devices 200a to 200f may have wavelength conversion layers 221 with different areas and/or thicknesses in different sub-pixels of different colors. The areas and the thicknesses of the wavelength conversion layers 221 can be adjusted according to different requirements as the above mentions.

Figure 3A:
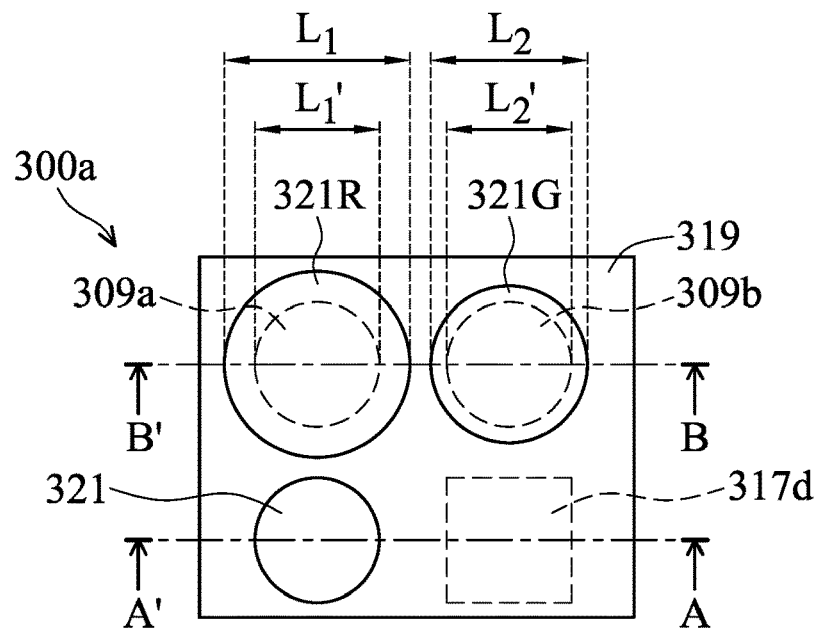
FIG. 3A is a top view of a display device in accordance with some embodiments.
Figure 3B:
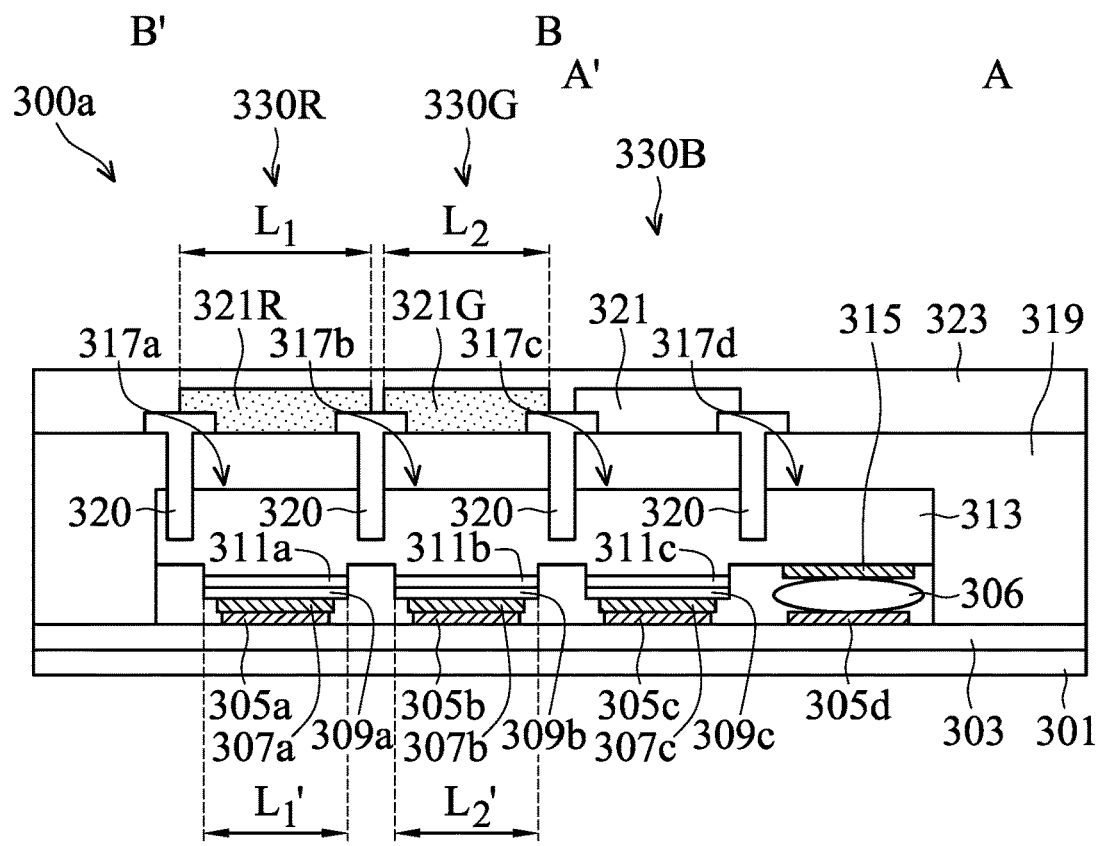
FIG. 3B is a cross-sectional view of the display device along line A-A' and line B-B' of FIG. 3A.

Referring to FIG. 3A, a top view of a display device 300a according to some embodiments is shown. FIG. 3B is a cross-sectional view of the display device 300a along line A-A' and line B-B' of FIG. 3A. The display device 300a is a top-emission display device.

As shown in FIGS. 3A and 3B, the display device 300a has three sub-pixels (i.e. a red sub-pixel 330R, a green sub-pixel 330G and a blue pixel 330B) in one LED chip. In some embodiments, the display device 300a includes a driving layer 303 disposed on a substrate 301. The display device 300a also includes three light-emitting elements 317a, 317b, 317c and a conductive structure 317d respectively electrically connected to the conductive pads 305a, 305b, 305c and 305d that are disposed on the driving layer 303.

The light-emitting element 317a is composed of a P-type electrode 307a, a P-type semiconductor layer 309a, a multiple quantum well layer 311a and a portion of an N-type semiconductor layer 313 that is located on the multiple quantum well layer 311a. Similarly, the light-emitting element 317b is composed of a P-type electrode 307b, a P-type semiconductor layer 309b, a multiple quantum well layer 311b and another portion of the N-type semiconductor layer 313 that is located on the multiple quantum well layer 311b. Also, the light-emitting element 317c is composed of a P-type electrode 307c, a P-type semiconductor layer 309c, a multiple quantum well layer 311c and another portion of the N-type semiconductor layer 313 that is located on the multiple quantum well layer 311c. In addition, the conductive structure 317d is composed of a bump 306, an N-type electrode 315 and another portion of the N-type semiconductor layer 313 that is located on the N-type electrode 315.

In the embodiment of FIGS. 3A and 3B, the electric current flows from the N-type electrode 315 to the P-type electrodes 307a, 307b and 307c by sequentially passing through the N-type semiconductor layer 313, the multiple quantum well layers 311a, 311b, 311c and the P-type semiconductor layers 309a, 309b, 309c. In some embodiments, the N-type electrode 315 (also called a first electrode) is disposed on the substrate 301, and the light-emitting elements 317a, 317b, 317c are electrically connected to the N-type electrode 315.

Still referring to FIGS. 3A and 3B, a wavelength conversion layer 321R is disposed directly above the light-emitting element 317a, a wavelength conversion layer 321G is disposed directly above the light-emitting element 317b, and an organic layer 321 is disposed directly above the light-emitting element 317c. Some materials and processes used to form the wavelength conversion layers 321R, 321G and the organic layer 321 are similar to, or the same as those used to form the wavelength conversion layers 130R, 130G and the organic layer 121 of FIG. 1A, and the descriptions thereof are not repeated herein. After forming the wavelength conversion layers 321R, 321G and the organic layer 321, a second passivation layer 323 is formed on the passivation layer 319 and covering the wavelength conversion layers 321R, 321G and the organic layer 321. Some materials and processes used to form the second passivation layer 323 are similar to, or the same as, those used to form the passivation layer 319, so the descriptions thereof are not repeated herein. Similar embodiments may have the same features if no second passivation layer is shown.

In this embodiment, the isolation structures 320 are light-blocking structures (e.g. black matrix (BM) structures), and can include, but is not limited to, black photoresist, black printing ink, black resin or any other suitable light-blocking materials of various colors. The isolation structures 320 are used to absorb and isolate the light emitted from the light-emitting elements 317a, 317b and 317c. The isolation structures 320 may be formed by performing an etching process, and then performing a coating or deposition process. For example, after forming several trenches in the passivation layer 319 and the N-type semiconductor layer 313 by an etching process, a material of the isolation structures 320 are coating or deposited in the trenches by a chemical vapor deposition (CVD) process, a physical vapor deposition (PVD) process, a metal organic chemical vapor deposition (MOCVD) process, or a combination thereof.

Still referring to FIGS. 3A and 3B, a wavelength conversion layer 321R is disposed directly above the light-emitting element 317a, a wavelength conversion layer 321G is disposed directly above the light-emitting element 317b, and an organic layer 321 is disposed directly above the light-emitting element 317c. Some materials and processes used to form the wavelength conversion layers 321R, 321G and the organic layer 321 are similar to, or the same as those used to form the wavelength conversion layers 130R, 130G and the organic layer 121 of FIG. 1A, and the descriptions thereof are not repeated herein.

The wavelength conversion layers 321R and 321G can convert the wavelength of the light emitted from the light-emitting elements 317a and 317b, so that the color and the wavelength of the light emitted from the light-emitting elements 317a and 317b may be changed. In this embodiment, the light-emitting elements 317a, 317b and 317c are blue light-emitting diodes. The blue light emitted from the light-emitting element 317a can be converted to a red light by the wavelength conversion layer 321R, and the blue light emitted from the light-emitting element 317b can be converted to a green light by the wavelength conversion layer 321G. In addition, the blue light emitted from the light-emitting element 317c is not converted to other colors, the wavelength of the light passing through the organic layer 321 remains unchanged in this embodiment.

In some embodiments, the wavelength conversion layer 321R has a length L1, the wavelength conversion layer 321G has a length L2, the P-type semiconductor layer 309a has a length L1', and the P-type semiconductor layer 309b has a length L2'. As shown in FIGS. 3A and 3B, the length L1' is the same as the length L2', the length L1 is greater than the length L2, and both the lengths L1 and L2 are greater than the lengths L1' and L2'. In other words, each of the wavelength conversion layers 321R and 321G has an area that is greater than that of the P-type semiconductor layers 309a and 309b from the top view illustrated in FIG. 3A. Since the length L1 is greater than the length L2, the area of the wavelength conversion layer 321R is greater than the area of the wavelength conversion layer 321G. Moreover, although the top view of FIG. 3A shows that the wavelength conversion layers 321R and 321G are circular, the wavelength conversion layers 321R and 321G can actually be square, rectangular, elliptical or other shapes from a top view.

Similar to the display device 100a as shown in FIG. 1A, the second conversion efficiency of the wavelength conversion layer 321G is greater than the first conversion efficiency of the wavelength conversion layer 321R. Therefore, by setting the area of the wavelength conversion layer 321G less than the area of the wavelength conversion layer 321R, the energy of the light converted by the wavelength conversion layers 321R and 321G can be similar or the same. As a result, the brightness distribution of the light emitted from the display device 100a can be more uniform, and the color gamut can be wider. Moreover, the color temperature of the entire display device can be fine-tuned by adjusting the area and/or the thickness of the wavelength conversion layers for different sub-pixels of different colors in the display device.

Since the conversion efficiency may depend on the material of the wavelength conversion layers 321R and 321G, if the first conversion efficiency of the wavelength conversion layer 321R is greater than the second conversion efficiency of the wavelength conversion layer 321G, the area of the wavelength conversion layer 321R should be less than the area of the wavelength conversion layer 321G.

Furthermore, it is important to note that the wavelength conversion layers 321R and 321G, and the organic layer 321 extend onto a portion of the isolation structures 320. The purpose is to ensure the light emitted from the light-emitting elements 317a, 317b and 317c can pass through the wavelength conversion layers 321R and 321G, and the organic layer 321 without any leakage. Since the areas of the wavelength conversion layers 321R and 321G are greater than the areas of the P-type semiconductor layers 309a and 309b, the light emitted from the light-emitting elements 317a and 317b can be reflected inside the wavelength conversion layers 321R and 321G, and the light energy released from the wavelength conversion layers 321R and 321G can be amplified.

In addition, although the area of the organic layer 321 from the top view depicted in FIG. 3A is the same as the area of the light-emitting element 317c, the area of the organic layer 321 can actually be greater than the area of the light-emitting element 317c. In some embodiments, from the top view depicted in FIG. 3A, the area of the wavelength conversion layers 321R and 321G can be greater than the area of the organic layer 321.

As shown in FIGS. 3A and 3B, the light-emitting elements 317a, 317b and 317c share the N-type semiconductor layer 313 and the common N-type electrode 315 in one LED chip. Since the light-emitting elements 317a, 317b and 317c are physically connected by the N-type semiconductor layer 313 (also called the LED chip), the pick-and-place process for forming the display device 300a can be simplified, and the production yield can be increased efficiently. For example, if the light-emitting elements 317a, 317b and 317c are separated, the pick-and-place process step for the light-emitting elements 317a, 317b and 317c should be a multiple-step process, such as a three-step process. However, in the process of forming the display device 300a, the pick-and-place process step for the light-emitting elements 317a, 317b and 317c can be a single-step process.

Figure 3C:
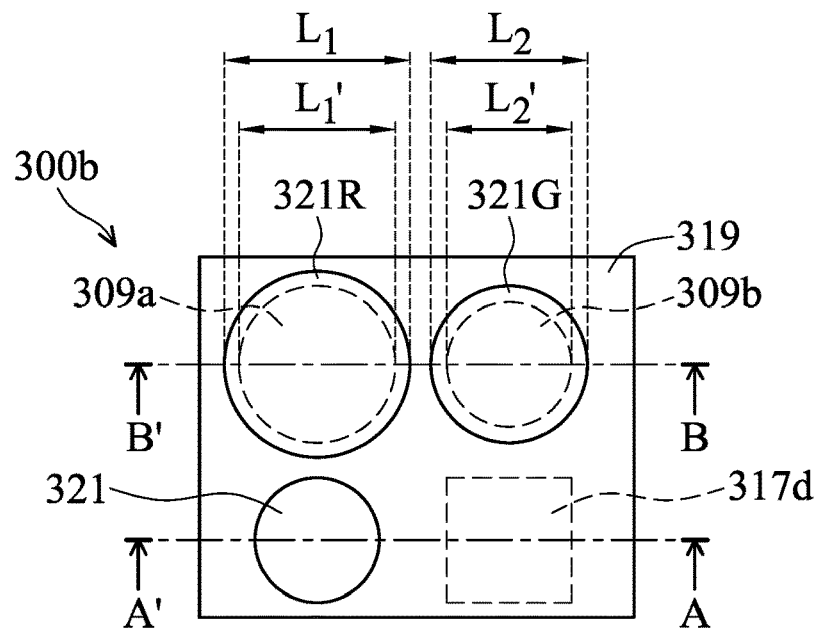
FIG. 3C is a top view of a display device in accordance with some embodiments
Figure 3D:
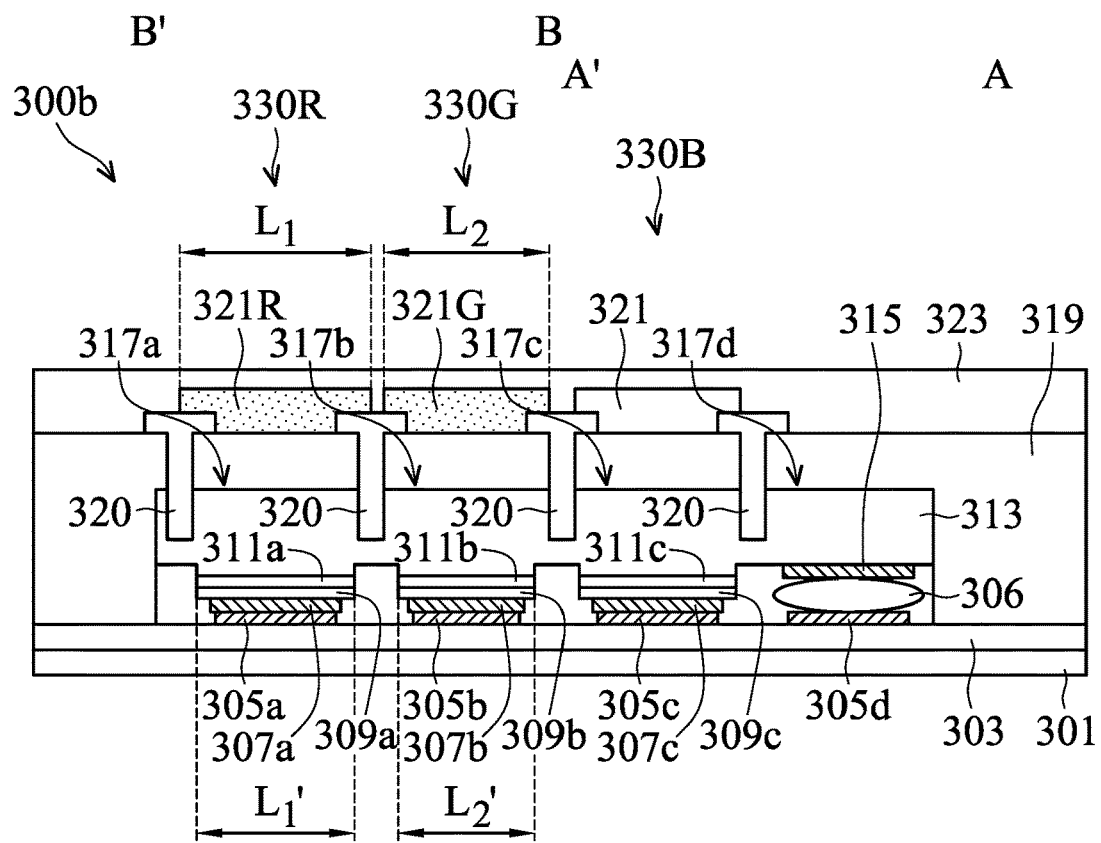
FIG. 3D is a cross-sectional view of the display device along line A-A' and line B-B' of FIG. 3C.

Referring to FIG. 3C, the top view of a display device 300b according to some embodiments is shown. FIG. 3D is a cross-sectional view of the display device 300b along line A-A' and line B-B' of FIG. 3C. The display device 300b is a top-emission display device.

The same as the display device 300a of FIGS. 3A and 3B, the length L1 of the wavelength conversion layer 321R is greater than the length L2 of the wavelength conversion layer 321G in the display device 300b of FIGS. 3C and 3D. The difference is that the length L1' of the P-type semiconductor layer 309a is not the same as the length L2' of the P-type semiconductor layer 309b in the display device 300b. In fact, the length L1' is greater than the length L2'. In other words, from the top view depicted in FIG. 3C, the P-type semiconductor layer 309a has an area which is greater than that of the P-type semiconductor layer 309b.

It is important to note that, both the lengths L1 and L2 are greater than the lengths L1' and L2'. Similar to the display device 300a of FIGS. 3A and 3B, the second conversion efficiency of the wavelength conversion layer 321G is greater than the first conversion efficiency of the wavelength conversion layer 321R. Therefore, by setting the area of the wavelength conversion layer 321G less than the area of the wavelength conversion layer 321R, the energy of the light converted by the wavelength conversion layers 321R and 321G can be similar or the same.

Figure 3E:
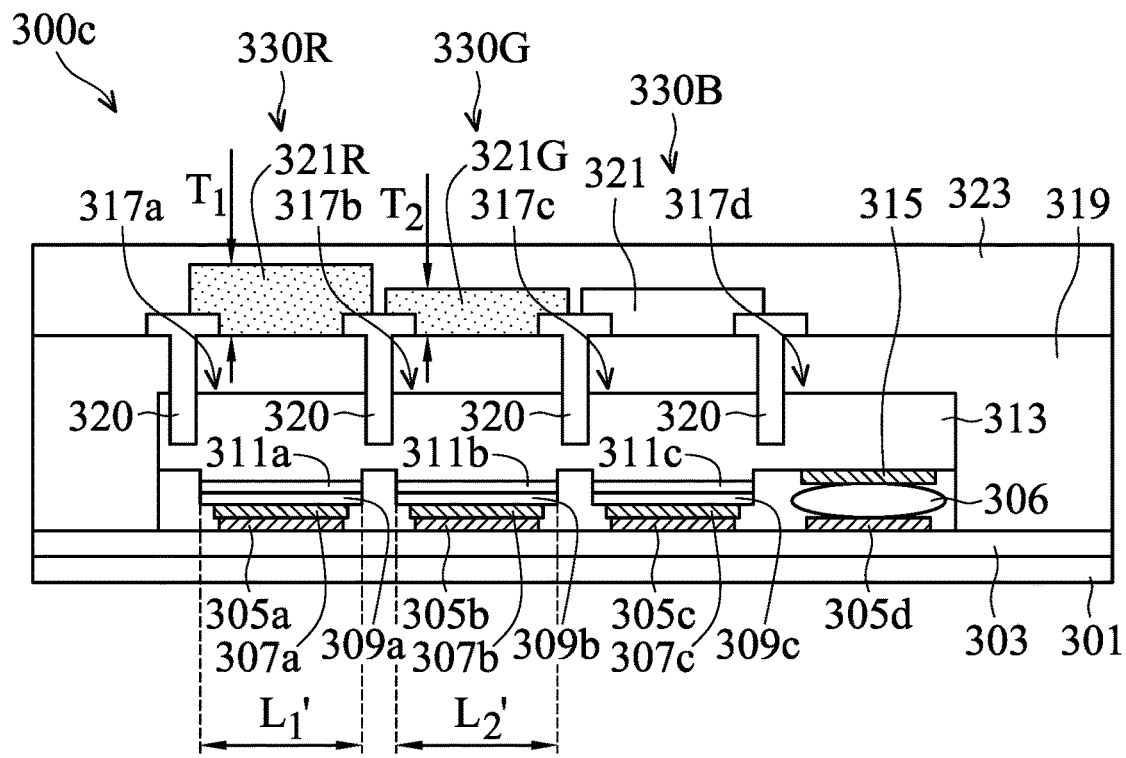
FIG. 3E is a cross-sectional view of a display device in accordance with some embodiments.

Referring to FIG. 3E, a cross-sectional view of a display device 300c according to some embodiments is shown. The display device 300c is a top-emission display device.

In this embodiment, the wavelength conversion layer 321R directly above the light-emitting element 317a has a thickness T1, the wavelength conversion layer 321G directly above the light-emitting element 317b has a thickness T2. Since the second conversion efficiency of the wavelength conversion layer 321G is greater than the first conversion efficiency of the wavelength conversion layer 321R, the thickness T1 is adjusted to be greater than the thickness T2. In addition, the length (or the area, from a top view) of each of the wavelength conversion layers 321R and 321G is the same.

In other embodiments, both the thickness and the area of the wavelength conversion layer 321R can be different from the thickness and the area of the wavelength conversion layer 321G. In addition, the length L1' of the P-type semiconductor layer 309a is the same as the length L2' of the P-type semiconductor layer 309b. In some other embodiments, the lengths L1' and L2' may be adjusted according to different applications.

Figure 4A:
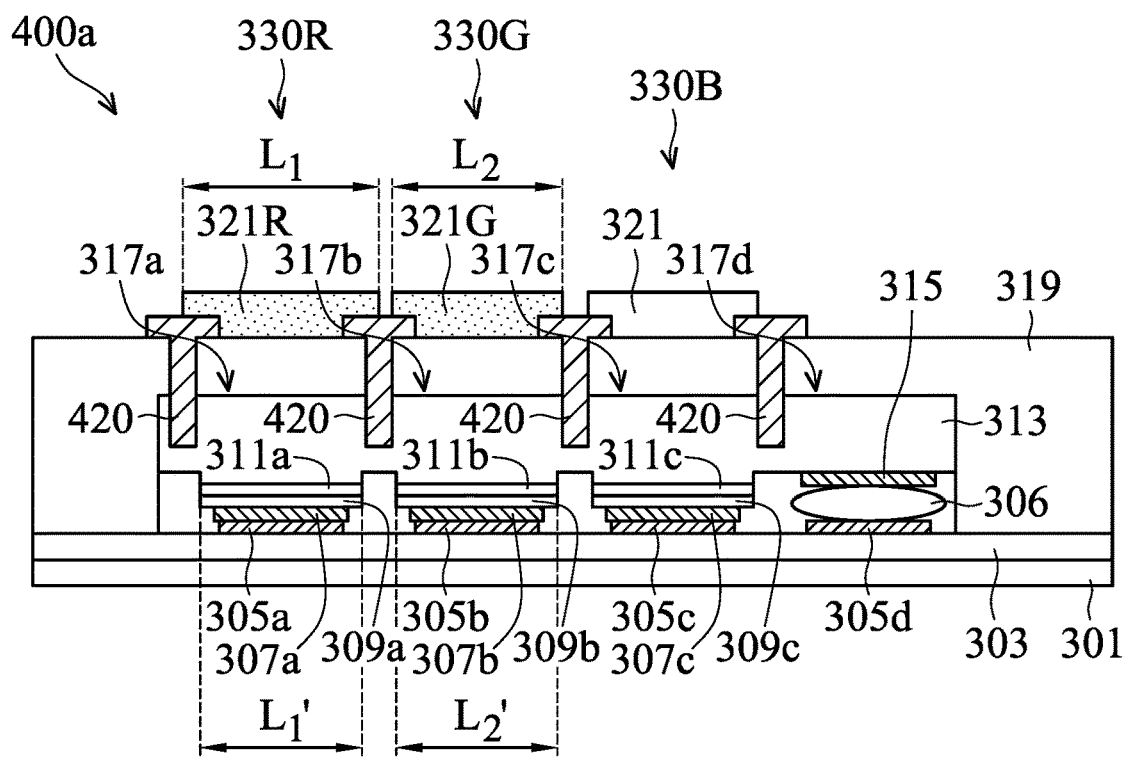
FIGS. 4A to 4C are cross-sectional views of display devices in accordance with some embodiments.

Referring to FIG. 4A, a cross-sectional view of a display device 400a according to some embodiments is shown. The display device 400a is a top-emission display device.

In comparison with the display device 300a of FIG. 3B, the material of the isolation structures 320 of the display device 300a is changed in the display device 400a. As shown in FIG. 4A, a plurality of isolation structures 420 (also called reflective structures), which are made of a metal, such as aluminum (Al), are disposed between the light-emitting elements 317a, 317b, 317c and the conductive structure 317d. Similar to the isolation structures 320 of the display device 300a, the isolation structures 420 are used to reflect and isolate the light emitted from the light-emitting elements 317a, 317b and 317c. In addition, since the second conversion efficiency of the wavelength conversion layer 321G is greater than the first conversion efficiency of the wavelength conversion layer 321R, the length L1 of the wavelength conversion layer 321R is greater than the length L2 of the wavelength conversion layer 321G. In other words, the area of the wavelength conversion layer 321R is greater than the area of the wavelength conversion layer 321G from a top view.

Figure 4B:
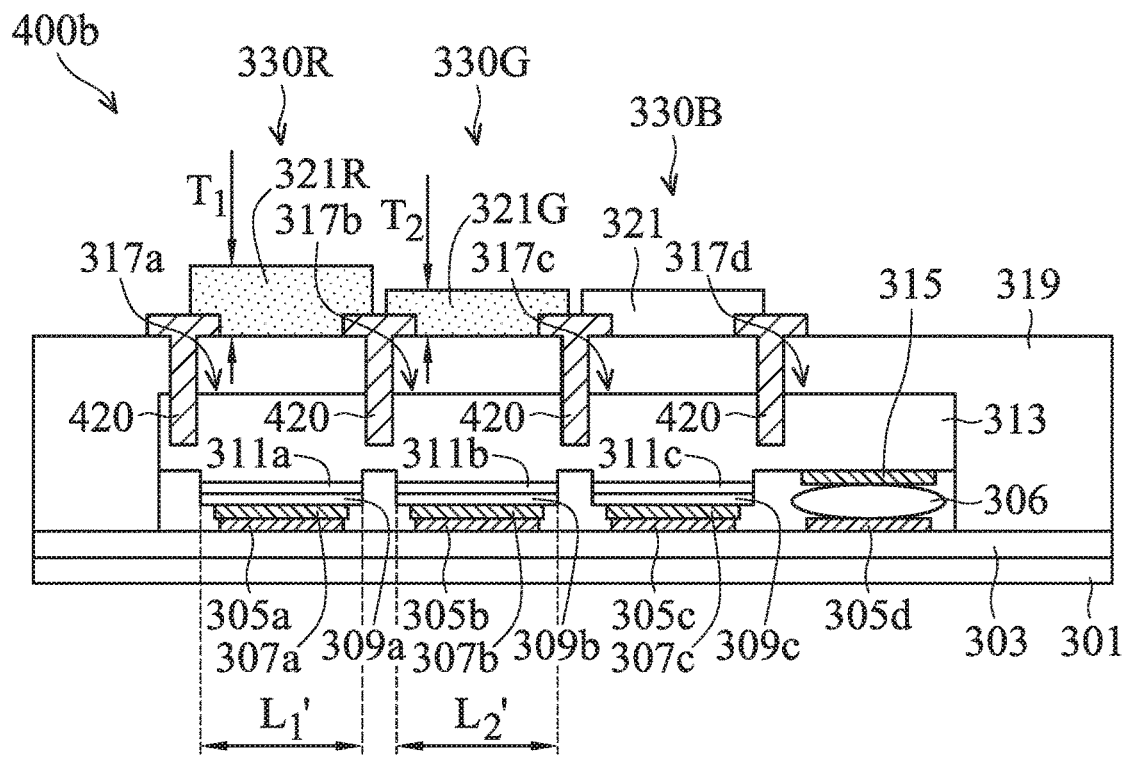

Referring to FIG. 4B, a cross-sectional view of a display device 400b according to some embodiments is shown. The display device 400b is a top-emission display device.

In comparison with the display device 300c of FIG. 3E, the material of the isolation structures 320 of the display device 300c is changed in the display device 400b. As shown in FIG. 4B, a plurality of isolation structures 420 (also called reflective structures), which are made of a metal, such as aluminum (Al), are disposed between the light-emitting elements 317a, 317b, 317c and the conductive structure 317d. Similar to the isolation structures 320 of the display device 400a, the isolation structures 420 are used to reflect and isolate the light emitted from the light-emitting elements 317a, 317b and 317c. In addition, the wavelength conversion layer 321R directly above the light-emitting element 317a has a thickness T1, the wavelength conversion layer 321G directly above the light-emitting element 317b has a thickness T2. Since the second conversion efficiency of the wavelength conversion layer 321G is greater than the first conversion efficiency of the wavelength conversion layer 321R, the thickness T1 is adjusted to be greater than the thickness T2.

Figure 4C:
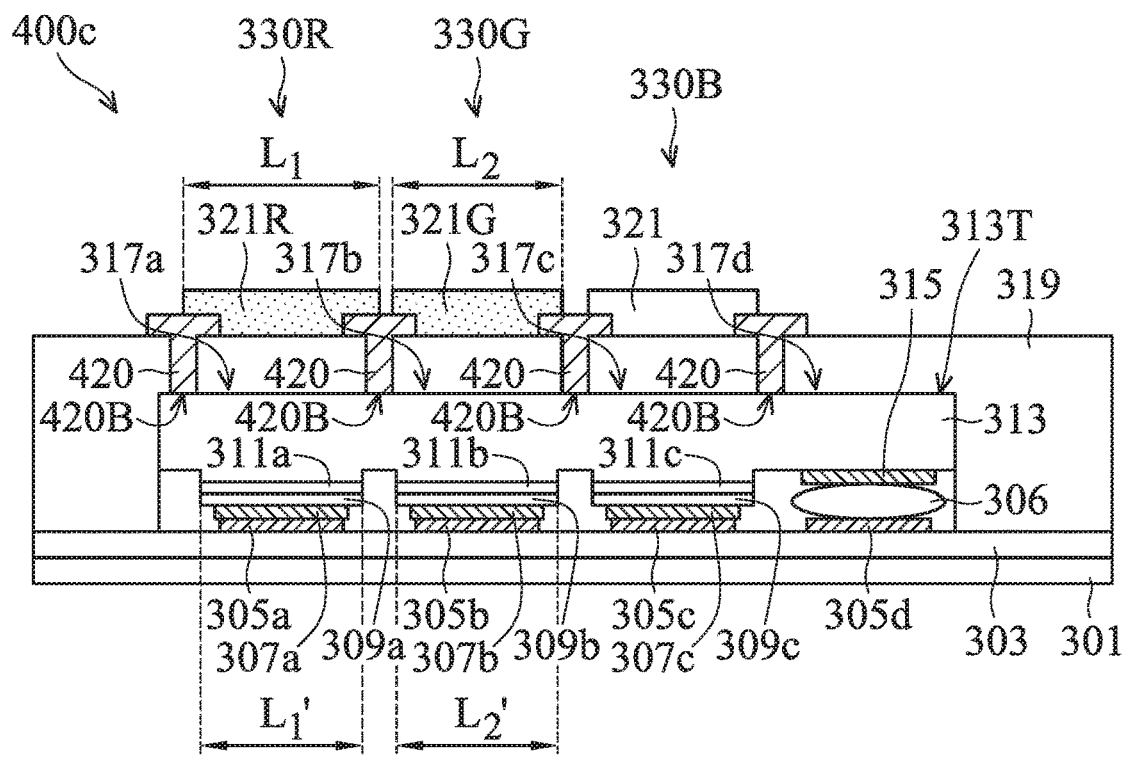

Referring to FIG. 4C, a cross-sectional view of a display device 400c according to some embodiments is shown. The display device 400c is a top-emission display device.

Similar to the display devices 400a and 400b of FIGS. 4A and 4B, the isolation structures 420 (also called reflective structures) of display device 400c, which are made of a metal, such as aluminum (Al), are disposed between the light-emitting elements 317a, 317b, 317c and the conductive structure 317d. In the embodiments of FIG. 4C, the isolation structures 420 are not extended into the N-type semiconductor layer 313. Specifically, the bottom surface 420B of the isolation structures 420 is level with the top surface 313T of the N-type semiconductor layer 313, which is also the top surface of the first light-emitting elements 317a, 317b, 317c and the conductive structure 317d.

In other embodiments, the bottom surface 420B of the isolation structures 420 may be located inside the passivation layer 319. That is, the bottom surface 420B of the isolation structures 420 may be higher than the top surface 313T of the N-type semiconductor layer 313.

Figure 5A:
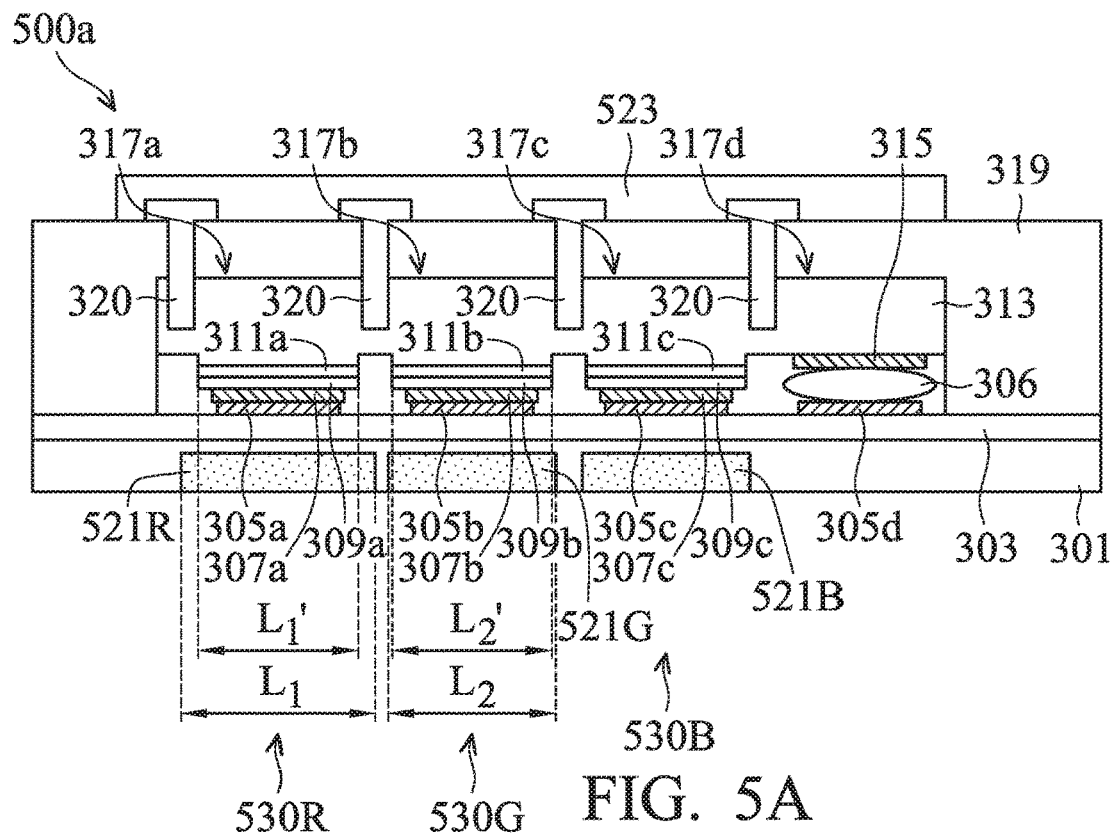
FIGS. 5A and 5B are cross-sectional views of display devices in accordance with some embodiments.

Referring to FIG. 5A, a cross-sectional view of a display device 500a according to some embodiments is shown. The display device 500a is a bottom-emission display device.

As shown in FIG. 5A, the display device 500a has three sub-pixels (i.e. a red sub-pixel 530R, a green sub-pixel 530G and a blue pixel 530B) in one LED chip. Moreover, a plurality of wavelength conversion layers 521R, 521G and 521B are embedded in the substrate 301, and a portion of the substrate 301 is disposed between the wavelength conversion layers 521R, 521G, 521B and the light-emitting elements 317a, 317b and 317c. Moreover, the display device 500a further includes a reflective layer 523 disposed on the passivation layer 319 and covering the isolation structures 320.

In this embodiment, the light emitted from the light-emitting elements 317a, 317b and 317c are reflected by the reflective layer 523 and passing through the wavelength conversion layers 521R, 521G and 521B. Therefore, the light emitted from the light-emitting elements 317a, 317b and 317c comes out from the substrate 301 side of the display device 500a. In addition, the material of the reflective layer 523 may be a metal such as aluminum (Al) or another suitable metal.

In addition, since the second conversion efficiency of the wavelength conversion layer 521G is greater than the first conversion efficiency of the wavelength conversion layer 521R, the length L1 of the wavelength conversion layer 521R is greater than the length L2 of the wavelength conversion layer 521G. In other words, the area of the wavelength conversion layer 521R is greater than that of the wavelength conversion layer 521G from a top view. In addition, the length L1' of the P-type semiconductor layer 309a is the same as the length L2' of the P-type semiconductor layer 309b. In other embodiments, the lengths L1' and L2'may be adjusted according to different applications.

Figure 5B:
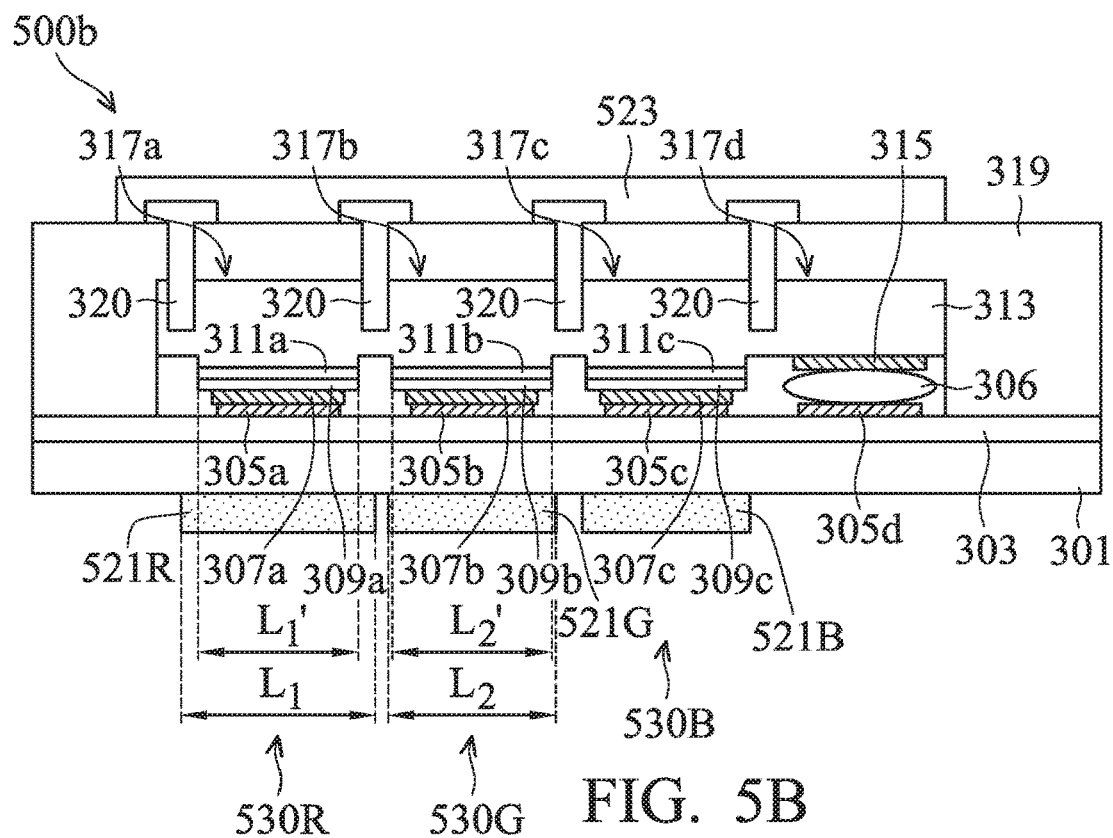

Referring to FIG. 5B, a cross-sectional view of a display device 500b according to some embodiments is shown. The display device 500b is a bottom-emission display device.

Similar to the display device 500a of FIG. 5A, the display device 500b of FIG. 5B has three sub-pixels (i.e. a red sub-pixel 530R, a green sub-pixel 530G and a blue pixel 530B) in one LED chip, and the display device 500b includes a reflective layer 523 disposed on the passivation layer 319 and covering the isolation structures 320. The difference between FIGS. 5A and 5B is that the light-emitting elements 317a, 317b and 317c are disposed on one side of the substrate 301, and the wavelength conversion layers 521R, 521G and 521B are disposed on the other side of the substrate 301. In other words, the entire substrate 301 is disposed between the wavelength conversion layers 521R, 521G, 521B and the light-emitting elements 317a, 317b and 317c.

In this embodiment, the light emitted from the light-emitting elements 317a, 317b and 317c are reflected by the reflective layer 523 and passing through the wavelength conversion layers 521R, 521G and 521B.

Similar to the display device 500a of FIG. 5A, since the second conversion efficiency of the wavelength conversion layer 521G is greater than the first conversion efficiency of the wavelength conversion layer 521R, the length L1 of the wavelength conversion layer 521R is greater than the length L2 of the wavelength conversion layer 521G. In other words, the area of the wavelength conversion layer 521R is greater than that of the wavelength conversion layer 521G from a top view. In addition, the length L1' of the P-type semiconductor layer 309a is the same as the length L2' of the P-type semiconductor layer 309b. In other embodiments, the lengths L1' and L2' may be adjusted according to different applications.

Figure 6A:
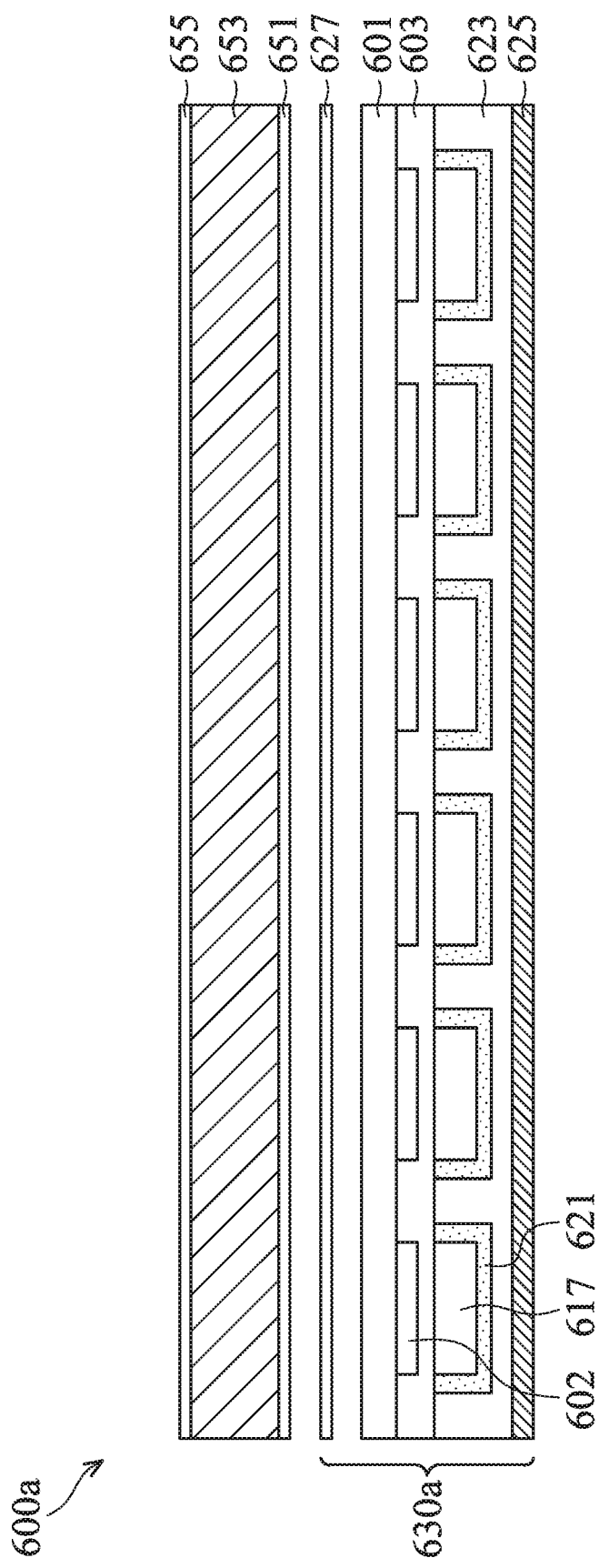
FIGS. 6A to 6C are cross-sectional and partially exploded views of display devices in accordance with some embodiments.

Referring to FIG. 6A, a cross-sectional and partially exploded view of a display device 600a according to some embodiments is shown. In some embodiments, the display device 600a is a liquid-crystal display (LCD) with a backlight module using LEDs as light sources, and the LED backlight module is a bottom-emission structure.

As shown in FIG. 6A, an liquid-crystal display panel 653 with a first polarizing film 651 and a second polarizing film 655 respectively formed on its two opposite sides is provided in the display device 600a. In other words, the liquid-crystal display panel 653 is sandwiched by the first polarizing film 651 and the second polarizing film 655. The liquid-crystal display panel 653 can be fabricated by known art. In some embodiments, the second polarizing film 655 may be made from polyvinyl alcohol (PVA) mixed with iodine (I) molecules, potassium iodide (KI), triacetate fiber, or a combination thereof.

The display device 600a further includes a backlight module 630a. The backlight module 630a may include but not limited to a driving layer 603 disposed on a substrate 601, the driving layer has a plurality of thin-film transistors (TFT) 602 therein. The backlight module 630a also includes an insulating layer 623 and a plurality of light-emitting elements 617 disposed on the driving layer 603, and the light-emitting elements 617 are covered by the insulating layer 623. The locations of the light-emitting elements 617 correspond to the locations of the thin-film transistors 602, and each of the light-emitting elements 617 has a wavelength conversion layer 621 covering its surface. In fact, each of the light-emitting elements 617 has a surface which is in direct contact with the driving layer 603, and the surfaces of the light-emitting elements are not covered by the wavelength conversion layers 621.

The backlight module 630a further includes a reflective layer 625 formed on the insulating layer 623. In addition, the substrate 601 of the backlight module 630a has a surface facing the liquid-crystal display panel 653, and the backlight module 630a further includes a brightness enhancement film (BEF) 627 which is disposed between the substrate 601 and the liquid-crystal display panel 653.

Some materials and processes of the substrate 601, the driving layer 603, the light-emitting elements 617, the wavelength conversion layers 621 and the insulating layer 623, are similar to, or the same as those used to form the substrate 101, the driving layer 103, the light-emitting elements 107a, 107b and 107c, the wavelength conversion layer 121R and 121G and the first passivation layer 119, so the descriptions thereof are not repeated herein. Moreover, some materials and processes of the reflective layer 625 are similar to, or the same as those used to from the reflective layer 229, so the descriptions thereof are not repeated herein.

In some embodiments, the light-emitting elements 617 may be micro light-emitting diodes (µ-LEDs). The brightness enhancement film 627 may be a dual brightness enhancement film. In addition, the material of the brightness enhancement film 627 may be selected from the group consisting of polyethylene-terephthalate (PET), polyethylene (PE), polyethylene napthalate (PEN), polycarbonate (PC), polyvinyl alcohol (PVA), polyvinyl chloride (PVC), or a combination thereof.

In the display device 600a, the light emitted from the light-emitting elements 617 passes through the wavelength conversion layers 621, and the wavelengths of the light may be changed by the wavelength conversion layers 621. Then, the light passes through the insulating layer 623 and may be reflected by the reflective layer 625. It is important to note that the reflective layer 625 can make the light evenly distributed.

Next, the light reflected by the reflective layer 625 reaches the liquid-crystal display panel 653 by sequentially passing through the driving layer 603, the substrate 601 and the brightness enhancements film 627. Specifically, the wavelength conversion layers 621 in different sub-pixels of different colors may have different areas and/or thicknesses. The areas and/or the thicknesses of the wavelength conversion layers 621 can be adjusted according to different requirements.

Figure 6B:
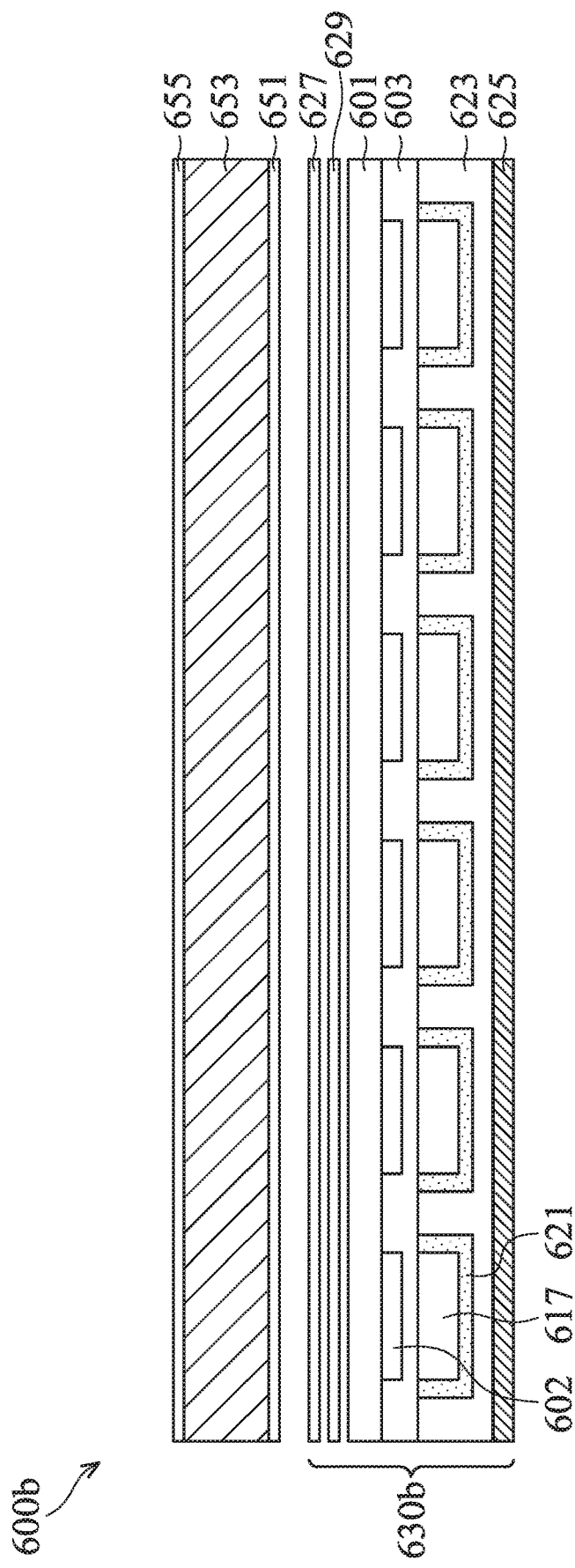

Referring to FIG. 6B, a cross-sectional and partially exploded view of a display device 600b according to some embodiments is shown. In some embodiments, the display device 600b is a liquid-crystal display (LCD) with a backlight module using LEDs as light sources, and the LED backlight module is a bottom-emission structure.

In comparison with the display device 600a, the backlight module 630b of the display device 600b further includes a quantum dot enhancement film 629, and the quantum dot enhancement film 629 is disposed between the brightness enhancement film 627 and the substrate 601. In some embodiments, the quantum dot enhancement film 629 may be formed by adding quantum dots to an optical layer, and the quantum dot enhancement film 629 may be a single-layer of quantum dot material or may include two or more sub-layers. For example, the quantum dot enhancement film 629 may be formed from a stack of quantum dot films each with a different type of quantum dots.

Figure 6C:
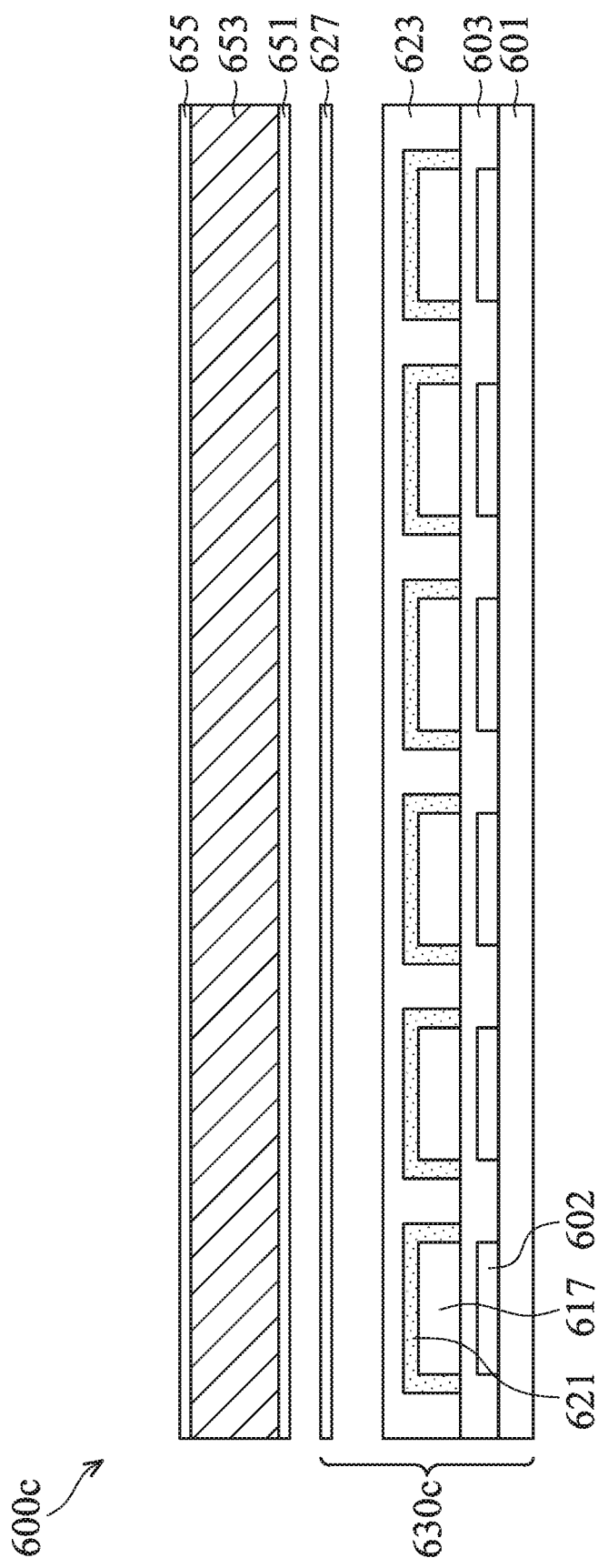

Referring to FIG. 6C, a cross-sectional and partially exploded view of a display device 600c according to some embodiments is shown. In some embodiments, the display device 600c is a liquid-crystal display (LCD) with a backlight module using LEDs as light sources, and the LED backlight module is a top-emission structure.

In comparison with the display device 600a, the backlight module 630a of the display device 600a is turned upside down in the display device 600c of FIG. 6C. Since the backlight module 630c is a top-emission structure, a reflective layer is omitted in the backlight module 630c.

Still referring to FIG. 6C, the light emitted from the light-emitting elements 617 reaches the liquid-crystal display panel 653 by sequentially passing through the wavelength conversion layers 621, the insulating layer 623 and the brightness enhancements film 627. To sum up, the light travels in a straight path without being reflecting by any reflective layer.

A conversion efficiency is a ratio of the energy of the light converted by a wavelength conversion layer to the energy of the light emitted from a light-emitting element thereunder. Since the conversion efficiencies of different conversion layers for different sub-pixels may be different, the embodiments of the display devices have wavelength conversion layers of different sizes in different sub-pixels, such as different areas and/or different thicknesses. Thereby, the energy of the light converted by the wavelength conversion layers of different sizes can be similar or the same. As a result, the brightness distribution of the light emitted from the display device can be more uniform, and the color gamut can be wider. Moreover, the color temperature of the entire display device can be fine-tuned by adjusting the area and/or the thickness of the wavelength conversion layers for different sub-pixels of the display device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
    a substrate;
    a light-emitting element disposed on the substrate and including a first multiple quantum well layer and a portion of a first semiconductor layer;
    a first wavelength conversion element disposed on the substrate;
    another light-emitting element disposed on the substrate and including a second multiple quantum well layer and another portion of the first semiconductor layer;
    a second wavelength conversion element disposed on the substrate; and
    a passivation layer, wherein the first wavelength conversion element is disposed between the light-emitting element and the passivation layer, the second wavelength conversion element is disposed between the another light-emitting element and the passivation layer, and the light-emitting element and the another light-emitting element share the first semiconductor layer, and a light emitted from the light-emitting element passes through the first wavelength conversion element and the passivation layer,
    an isolation structure disposed between the first wavelength conversion element and the second wavelength conversion element,
    wherein the light-emitting element comprises at least portion of the first semiconductor layer, a distance between a top surface of the first semiconductor layer and a surface of the substrate is defined as a first distance, a distance between a bottom surface of the isolation structure and the surface of the substrate is defined as a second distance, the first distance is greater than the second distance, and the second distance is greater than zero.

2. The display device as claimed in claim 1, wherein the passivation layer covers a sidewall of the first wavelength conversion element.

3. The display device as claimed in claim 1, wherein a thickness of the first wavelength conversion element and a thickness of the second wavelength conversion element are different.

4. The display device as claimed in claim 3, wherein the passivation layer comprises a first portion corresponding to the first wavelength conversion element and a second portion corresponding to the second wavelength conversion element, and a thickness of the first portion and a thickness of the second portion are different.

5. The display device as claimed in claim 1, wherein a color of light passing through the first wavelength conversion element and a color of light passing through the second wavelength conversion element are different.

6. The display device as claimed in claim 1, further comprising a driving layer electrically connected to the light-emitting element.

7. The display device as claimed in claim 1, wherein the isolation structure is directly in contact with the first wavelength conversion element and the second wavelength conversion element.

8. The display device as claimed in claim 1, wherein the light-emitting element further comprises a second semiconductor layer, the another light-emitting element further comprises a third semiconductor layer, and the second semiconductor layer has a length different from that of the third semiconductor layer.

* * * * *